United States Patent
Smith et al.

(10) Patent No.: US 11,693,383 B1
(45) Date of Patent: Jul. 4, 2023

(54) SYSTEMS AND METHODS FOR PROVIDING HUB-BASED MOTION DETECTION USING DISTRIBUTED, LIGHT-BASED MOTION SENSORS

(71) Applicant: SIGNIFY NORTH AMERICA CORPORATION, Somerset, NJ (US)

(72) Inventors: David Smith, San Jose, CA (US); Neil Joseph, Sunnyvale, CA (US)

(73) Assignee: SIGNIFY HOLDING B.V., Eindhoven (NL)

(*) Notice: Subject to any disclaimer, the term of this patent is extended or adjusted under 35 U.S.C. 154(b) by 569 days.

(21) Appl. No.: 15/658,526

(22) Filed: Jul. 25, 2017

Related U.S. Application Data

(63) Continuation-in-part of application No. 15/211,070, filed on Jul. 15, 2016, now Pat. No. 10,585,004, and
(Continued)

(51) Int. Cl.
*G05B 19/048* (2006.01)
*G01R 19/165* (2006.01)
(Continued)

(52) U.S. Cl.
CPC ........... *G05B 19/048* (2013.01); *F24F 11/30* (2018.01); *F24F 11/62* (2018.01); *G01R 19/165* (2013.01); *G01V 8/10* (2013.01); *H05B 45/20* (2020.01); *F24F 11/56* (2018.01); *F24F 11/64* (2018.01); *F24F 2110/10* (2018.01); *F24F 2120/10* (2018.01); *F24F 2120/12* (2018.01); *F24F 2120/14* (2018.01); *F24F 2130/30* (2018.01); *G05B 2219/2614* (2013.01); *G05B 2219/2642* (2013.01)

(58) Field of Classification Search
CPC ........... G05B 19/048; G05B 2219/2614; F24F 11/62; F24F 2120/10; F24F 11/30; F24F 2110/10; F24F 2130/30; F24F 2130/14; G01R 19/165; G01V 8/10; H05B 33/0872
See application file for complete search history.

(56) References Cited

U.S. PATENT DOCUMENTS

| | | | |
|---|---|---|---|
| 7,675,447 B1 * | 3/2010 | Coulson | H03M 3/494 341/143 |
| 7,863,829 B2 | 1/2011 | Sayers et al. | |

(Continued)

FOREIGN PATENT DOCUMENTS

| | | |
|---|---|---|
| JP | 2005306336 A | 11/2005 |
| JP | 2011076992 A | 4/2011 |

(Continued)

OTHER PUBLICATIONS

Roark, "Reverse Smoothing: a model-free data smoothing algorithm". 2004. (Year: 2004).*

*Primary Examiner* — Andrew Schechter
*Assistant Examiner* — Jeremy A Delozier

(57) ABSTRACT

Systems and methods are provided herein for determining motion in a volume using a lighting based sensor. A status of a light is determined with which a motion sensor is associated. Motion measurements are received from the motion sensor. Based on the motion measurements, a motion score is determined. A room status is adjusted based on the motion score.

24 Claims, 20 Drawing Sheets

Related U.S. Application Data a continuation-in-part of application No. 15/099,666, filed on Apr. 15, 2016, now Pat. No. 10,285,243, which is a continuation-in-part of application No. 14/288,911, filed on May 28, 2014, now Pat. No. 9,345,098.

(60) Provisional application No. 62/366,186, filed on Jul. 25, 2016, provisional application No. 62/192,879, filed on Jul. 15, 2015, provisional application No. 61/956,028, filed on May 31, 2013, provisional application No. 61/956,029, filed on May 31, 2013, provisional application No. 61/958,702, filed on Aug. 5, 2013.

(51) Int. Cl.
| | | |
|---|---|---|
| *G01V 8/10* | (2006.01) | |
| *F24F 11/30* | (2018.01) | |
| *F24F 11/62* | (2018.01) | |
| *H05B 45/20* | (2020.01) | |
| *F24F 11/56* | (2018.01) | |
| *F24F 130/30* | (2018.01) | |
| *F24F 11/64* | (2018.01) | |
| *F24F 120/12* | (2018.01) | |
| *F24F 120/10* | (2018.01) | |
| *F24F 110/10* | (2018.01) | |
| *F24F 120/14* | (2018.01) | |

(56) References Cited

U.S. PATENT DOCUMENTS

| | | | |
|---|---|---|---|
| 8,363,707 | B2 | 1/2013 | Hollis |
| 9,345,098 | B2 | 5/2016 | Joseph et al. |
| 9,607,507 | B1 * | 3/2017 | McClintock ............ G08C 17/04 |
| 9,854,647 | B2 | 12/2017 | Knaapen et al. |
| 2005/0117190 | A1 | 6/2005 | Iwauchi et al. |
| 2007/0188427 | A1 | 8/2007 | Lys et al. |
| 2007/0211013 | A1 | 9/2007 | Uehara et al. |
| 2010/0277068 | A1 | 11/2010 | Broitzman |
| 2011/0202151 | A1 | 8/2011 | Covaro et al. |
| 2012/0080944 | A1 | 4/2012 | Recker et al. |
| 2012/0170284 | A1 | 7/2012 | Shedletsky |
| 2012/0319585 | A1 | 12/2012 | Shteynberg et al. |
| 2015/0112452 | A1 * | 4/2015 | He ................. A61B 5/0285 |
| | | | 700/11 |
| 2016/0381763 | A1 * | 12/2016 | Loeb ................. H05B 37/0227 |
| | | | 315/297 |
| 2017/0188864 | A1 * | 7/2017 | Drury ................. A61B 5/0408 |

FOREIGN PATENT DOCUMENTS

| | | |
|---|---|---|
| JP | 2013008658 A | 1/2013 |
| JP | 2013069504 A | 4/2013 |
| JP | 2013084518 A | 5/2013 |
| WO | 2010/068538 A1 | 6/2010 |
| WO | 2013/138613 A1 | 9/2013 |

\* cited by examiner

SYSTEMS AND METHODS FOR PROVIDING HUB-BASED MOTION DETECTION USING DISTRIBUTED, LIGHT-BASED MOTION SENSORS

CROSS-REFERENCE TO RELATED APPLICATION

The present application claims priority to U.S. Provisional Patent Application No. 62/366,186, filed Jul. 25, 2016. The present application is a continuation-in-part of U.S. patent application Ser. No. 15/211,070, filed Jul. 15, 2016, which claims priority to U.S. Provisional Patent Application No. 62/192,879, filed Jul. 15, 2015. The present application is further a continuation-in-part of U.S. patent application Ser. No. 15/099,666, filed Apr. 15, 2016, which is a continuation-in-part of U.S. patent application Ser. No. 14/288,911, filed May 28, 2014, which claims the benefit of priority to the following U.S. Provisional Patent Applications: Ser. No. 61/956,028, filed May 31, 2013; Ser. No. 61/956,029 filed May 31, 2013; and Ser. No. 61/958,702, filed Aug. 5, 2013. The entirety of all of these applications is herein incorporated by reference in their entirety.

FIELD

This disclosure is related generally to lighting control and more particularly to controlling sensors and other functionality integrated into light bulbs.

BACKGROUND

Sensors can be incorporated into light bulbs to provide distributed sensing capabilities using existing power systems. For example, micro-location (e.g., single room, locations within a single room) temperature readings can be difficult to acquire using traditional building configurations. Typically, thermostats having temperature sensing capabilities are positioned at a limited number of locations in a building (e.g., certain rooms, at a single location in a large room). The limited locations from which to sample temperature data make it difficult to discern temperature at a high resolution. Higher resolution temperature data can be hugely beneficial in providing energy savings and efficiency while maintaining desired temperature comfort, and distributed light-based sensor systems can provide that higher resolution data, where a server can be utilized to coordinate the light-based sensors.

DETAILED DESCRIPTION

Light-based sensors can come in a variety of types. In certain examples, data from those light based sensors can be transmitted to a server to coordinate actions. For example, temperature sensors in light bulbs can be used to provide high resolution ambient temperature measurements of a volume, where a server can be used to coordinate heating, ventilation, and air conditioning (HVAC) systems accordingly. As another example, ambient light and/or motion can be measured at light bulbs, where light bulbs can individually adjust their level based on ambient light and/or motion measured at that light bulb, or coordinated light bulb adjustment can be performed through communication among light bulbs or with a server. The following paragraphs describe an example temperature sensing implementation.

Figure 1:
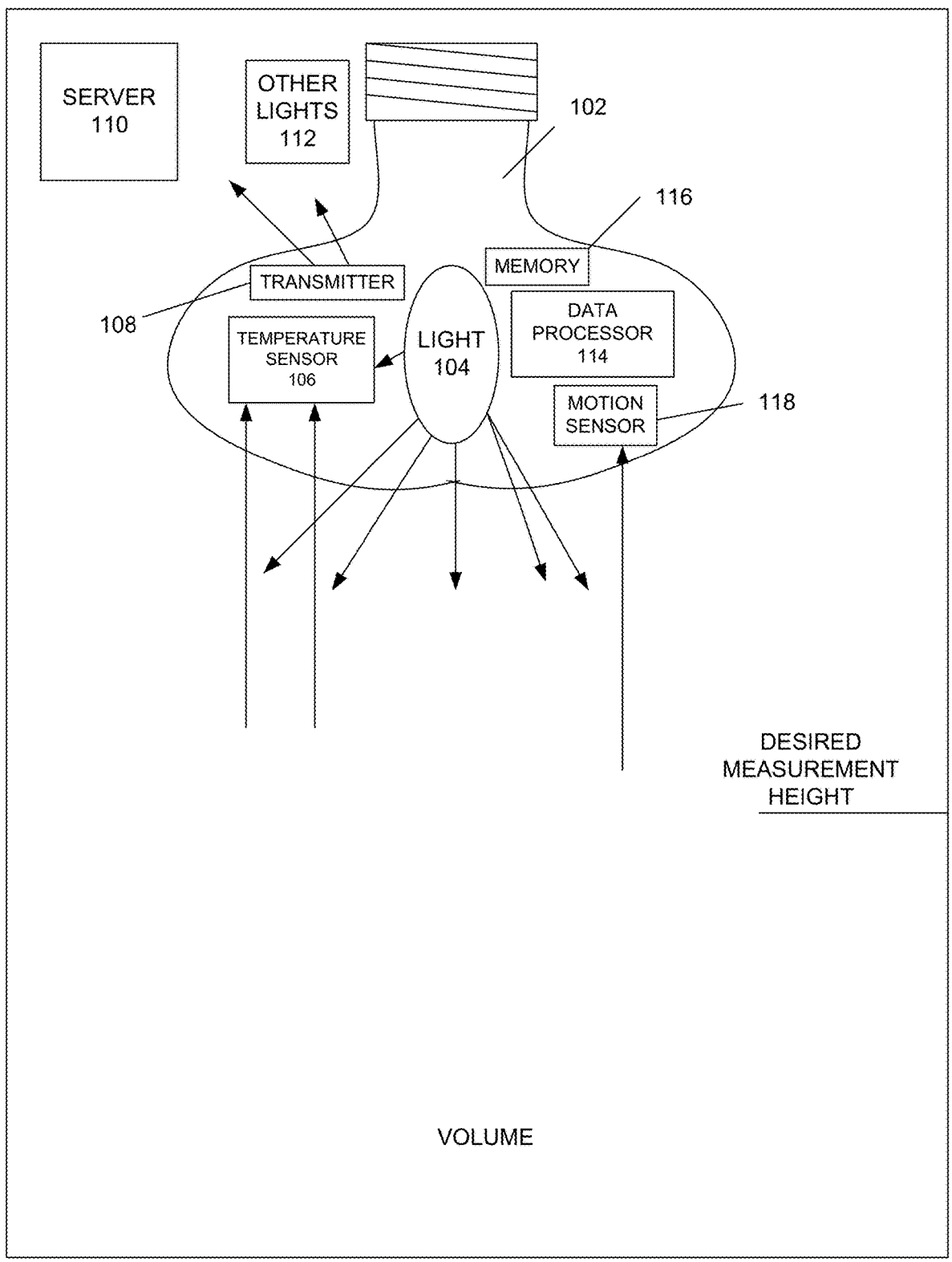
FIG. 1 is a diagram depicting a luminary (e.g., a light) configured to determine an ambient temperature in a volume using a lighting based sensor.

FIG. 1 is a diagram depicting a luminary (e.g., a light) configured to determine an ambient temperature in a volume using a lighting based sensor. As noted above, typical systems include a limited number of temperature sensors, at most one per room, but often one per group of rooms, per floor, or per building. One reason for the limited number of temperature sensors in an environment is a need to wire each temperature sensor. Such sensors traditionally require wiring for power as well as for data communication, such as to a manual or computer control for adjusting a heating/air conditioning unit (HVAC) output.

A luminary (e.g., a lighting fixture, light bulb, lamp, or light module that provides illumination) is typically a most common electronic device in a building. Systems and methods as described herein can, in some embodiments, take advantage of the existing power wiring that already exists in most environments for lighting for powering temperature sensors positioned within, on, or next to a lighting device. Having ready sources of power for the lighting devices that are already distributed in environments enables operation of these distributed temperature sensors. Wireless, or wired communications using existing infrastructure (e.g., transmitting signals via power lines connected to the lighting device) enables communications of measured temperatures from the lighting device to another device (e.g., a server, a thermostat, other lighting devices) that have the capability to adjust HVAC or other environment control settings.

FIG. 1 depicts an example light bulb 102 having a temperature sensor integrated within. The bulb 102 includes a light source 104 that can take a variety of forms including incandescent, halogen, fluorescent, CFL, HID, LPS, and light emitting diodes (LED). The light source 104 may be a simple on-off source 104 or may be adjustable to different levels of output, such as via a dimmer. The light source 104 emits light from the bulb 102 as indicated by the arrows emanating from the light source 102 out of the bulb. The light bulb 102 further includes a temperature sensor 106 (e.g., an infra-red sensor, a photo-detector that detects a phase shift in reflected light from the light source) that takes temperature measurements, based in part on a temperature of a volume (e.g., a room in a home, a portion of a warehouse or factory), as indicated by the arrows entering the light bulb 102 representing ambient heat reaching the temperature sensor 106. The temperature sensor 106 takes temperature measurements, and in the example of FIG. 1, uses a wireless transmitter 108 to transmit data indicative of those temperature sensors to outside entities, such as a server 110, other lights 112 (e.g., data is passed from light bulb to light bulb until it reaches the server, or is passed to a light bulb that has capabilities to update HVAC settings). In one embodiment, the light bulb 102 further includes a data processor 114 and memory 116. The data processor 114 and memory 116 can be used for temporary storage of temperature sensor 106 data (e.g., transmitting data to the server 110 in batches) as well as preprocessing of temperature data prior to transmission.

Following is a discussion of one example of such preprocessing. While installing temperature sensors in, on, or near lighting devices as described above accounts for the power and communications issues for distributed temperature sensing, it does not account for an added complication introduced by placing temperature sensors near light sources. Typically, light sources, like light source 104, emit heat. This is indicated by the arrow from light source 104 to temperature sensor 106. This light source 104 heat interferes with the measurement of ambient temperature of the volume by the temperature sensor 106. Thus, in one embodiment, the data processor 114 may adjust temperature data measured by the temperature sensor 106 based on whether the light source 104 is on or off. In other examples, more complex adjustments to temperature data may be made by the data processor 114, such as based on an amount of time that the light source 104 has been on or off or an output level (e.g., 50%, 90%, 100%) of the light source 104, as described further herein.

In one embodiment, the temperature sensing light bulb 102 seeks to measure temperature at a particular height (e.g., an average height of a person standing or sitting) in the volume. Because heat tends to rise, the ambient temperature near the light bulb 102 may be different than the temperature at a desired measurement height. The data processor may further preprocess the data to account for the temperature varying by height, such as by adjusting a temperature sensor 106 measurement by a particular amount or an adjustment factor, such as a factor informed by a calibration operation (e.g., manual measurement of a temperature at the desired measurement height compared to the ambient temperature nearer to the light bulb near a ceiling).

Preprocessing of temperature data by the data processor 114 may be based on other inputs as well, including heat put off by other devices in the light bulb 102 (e.g., transmitter 108, data processor 114, memory 116). Such adjustments to the temperature data may be based on an activity level of those devices, such as current processing load on the data processor 114 or the current throughput of data by transmitter 108, as those devices may produce more heat when working harder. In certain embodiments, preprocessing, as described in FIG. 1 as occurring in the light bulb 102, may be performed at other entities (e.g., other light bulbs 112 or the server 110), where such processing may be referred to as other than preprocessing (e.g., post processing).

In addition to sensing temperature, light bulb 102 can also include a motion sensor 118 to detect motion within the volume. Similar to temperature sensor 106, motion sensor 118 takes motion measurements, and in the example of FIG. 1, uses a wireless transmitter 108 to transmit data indicative of those motion sensors to outside entities, such as a server 110, other lights 112 (e.g., data is passed from light bulb to light bulb until it reaches the server, or is passed to a light bulb that has capabilities to update HVAC settings). The data processor 114 and memory 116 can be used for temporary storage of motion sensor 118 data (e.g., transmitting data to the server 110 in batches) as well as preprocessing of motion data prior to transmission. Data processor 114 can also process motion sensor 118 data using one or more algorithms described herein to adjust HVAC settings accordingly. In certain embodiments, preprocessing, as described in FIG. 1 as occurring in the light bulb 102, may be performed at other entities (e.g., other light bulbs 112 or the server 110), where such processing may be referred to as other than preprocessing (e.g., post processing).

Figure 2:
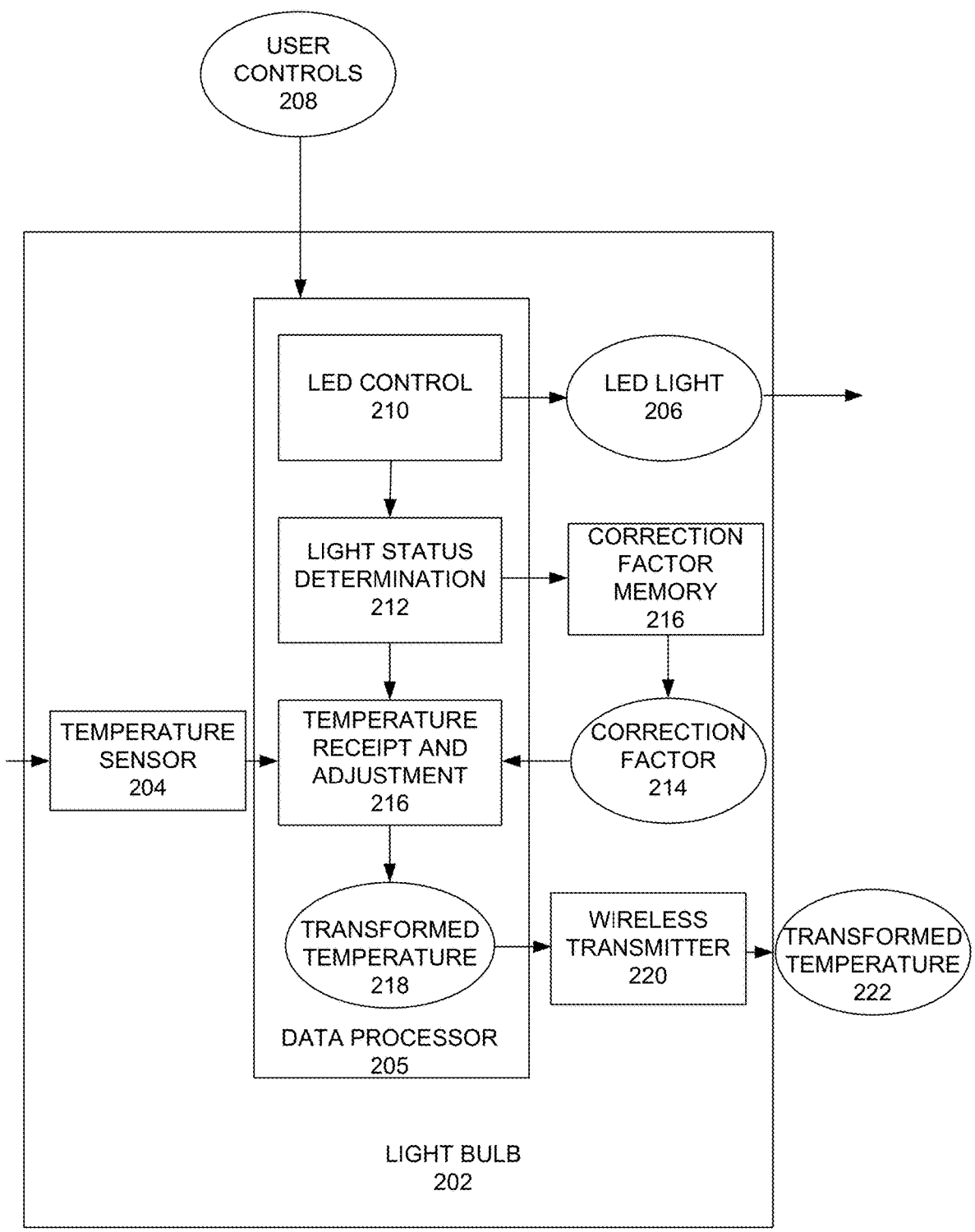
FIG. 2 is a diagram depicting example operations of a luminary based temperature sensor.

FIG. 2 is a diagram depicting example operations of a luminary based temperature sensor. FIG. 2 depicts a light bulb 202. The light bulb 202 includes an integrated temperature sensor 204 that measures a temperature at the temperature sensor 204. As discussed above, the temperature experienced by the temperature sensor 204 is influenced by the ambient temperature of the volume surrounding the light bulb 202 and heat produced by any components of the light bulb including the light source 206 as well as other components shown in FIG. 2, including data processor 205. In the example of FIG. 2, the light bulb 202 includes an LED light source 206. That light source is adjustable based on a user control 208. That user control 208 could be provided in an analog (e.g., via a knob) or digital (e.g., via a smart phone app control) form and sets the amount of light or other parameters (e.g., color, spectrum) of the light emitted by the LED light 206 as commanded by an LED control 210.

In addition to commanding the LED light 206, the LED control 210 also provides data to a light status determination module 212 for ascertaining a current state of the LED light 206. The status of the LED light 206 is useful for adjusting the temperature data acquired by the temperature sensor 204. As noted before, the light source 206 outputs heat that can influence the temperature sensed by the temperature sensor 204. But that influence is not the same at all times. For example, the light source's influence is negligible when the light source 206 has been off long enough to reach a steady state heat output compared to when the light source 206 has been on for a significant amount of time. The heat output of the light source 206 further varies during a period shortly after the light source 206 is turned on, turned off, or its power level is adjusted.

In one embodiment of the disclosure, the data processor 205 adjusts a temperature level output by the temperature sensor 204 according to a correction factor 214 stored in a correction factor memory 216. The correction factor memory 216 in one embodiment is a read only memory, preloaded with correction factors, while in another example, the memory 216 is a flash-type memory, where correction factors 214 can be adjusted, such as based on calibration operations. In the embodiment of FIG. 2, based on a current status of the light source 206 (e.g., the light source 206 was turned on 2 seconds ago) as determined at 212, a correction factor 214 is selected and applied at 216 to produced a transformed temperature 218 (e.g., correction factor=0.8; temperature sensor temp=100; transformed temperature=80). The transformed temperature 218 is provided to a wireless transmitter 220 for transmission outside of the light bulb 202, as indicated at 222, such as to a thermostat-controlling server.

Figure 3:
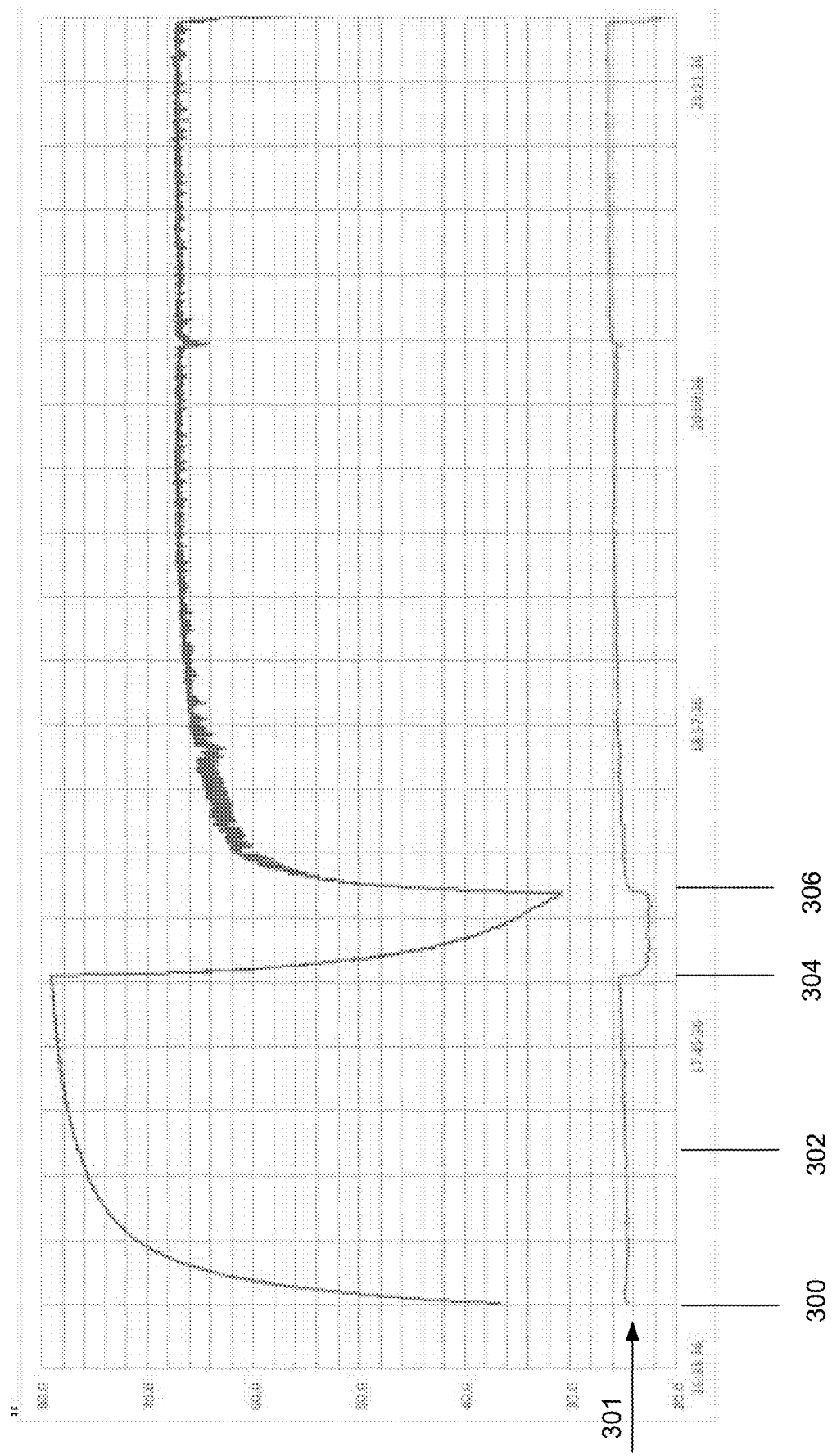
FIG. 3 is a diagram depicting temperature measurements made at a temperature sensor within a light bulb as a light source is transitioned to different states.
Figure 4:
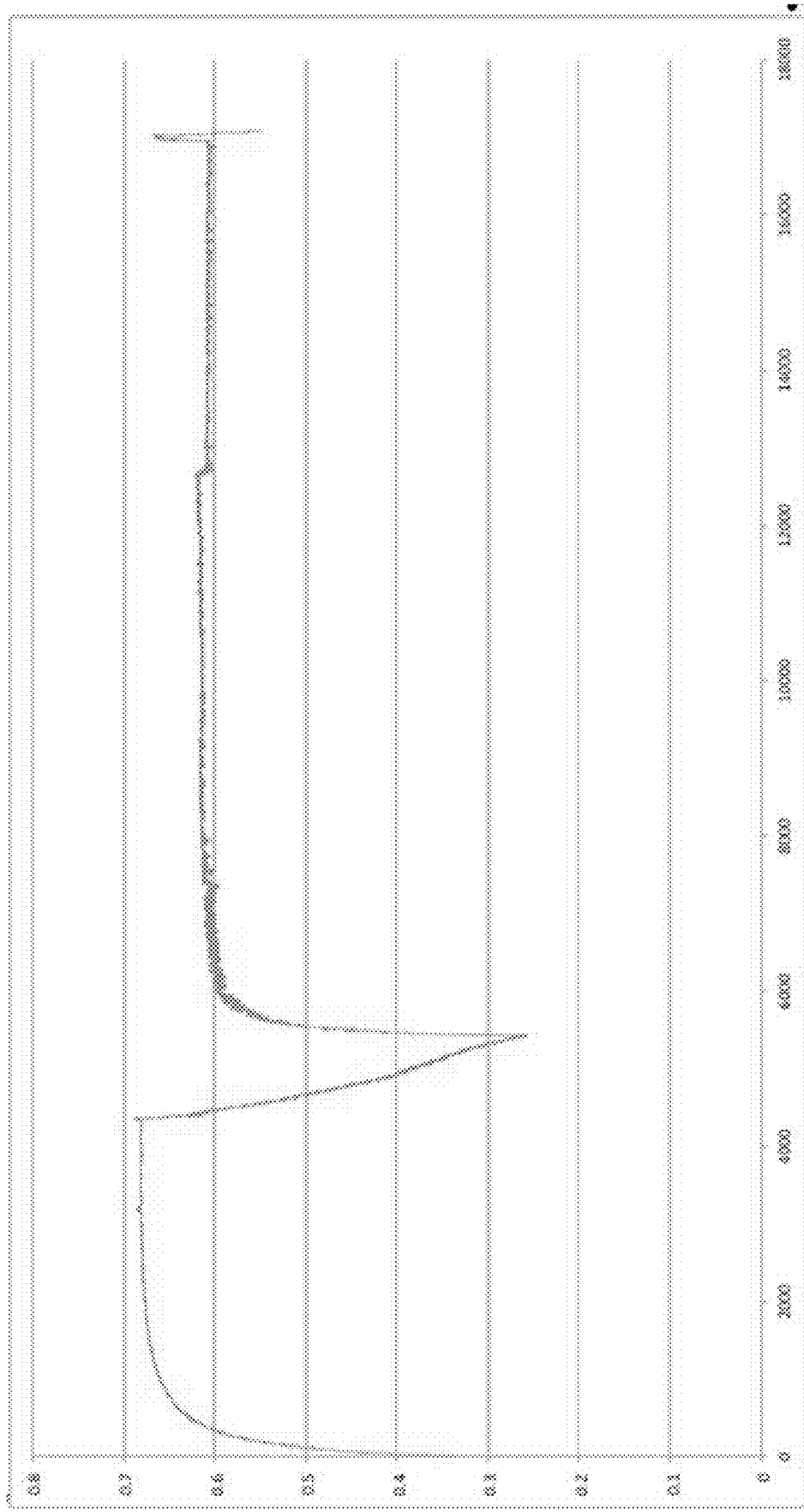
FIG. 4 is a diagram depicting a differential proportion between the internal thermo-probe temperature and ambient air temperature under the identical operating conditions of FIG. 3.

FIG. 3 is a diagram depicting temperature measurements made at a temperature sensor within a light bulb as a light source is transitioned to different states. Such measurements could be taken as part of a calibration operation, such as for identifying correction factors to be applied to sensed temperatures. At the time indicated as 300, the temperature sensor indicates a temperature near the ambient temperature of 30 degrees. A plot at 301 indicates a power level supplied to the light source. As the light source heats up during a period from 300 to 302, the sensed temperature increases at a fast rate. As the light source nears its steady-state heat output, the sensed temperature increase rate declines from 302 to 304, where at 304 the sensed temperature reaches a high point of near 80 degrees. At 304, the light source is turned off, beginning a period of rapid cooling from 304 to 306. At 306, the light source is powered at a 70% power level. The sensed temperature again quickly increases at first, followed by a slower approach to a steady state temperature sensed for the ambient environment in view of the heat outputted by the light source. FIG. 4 is a diagram depicting a differential proportion between the internal thermo-probe temperature and ambient air temperature under the identical operating conditions of FIG. 3.

Figure 5:
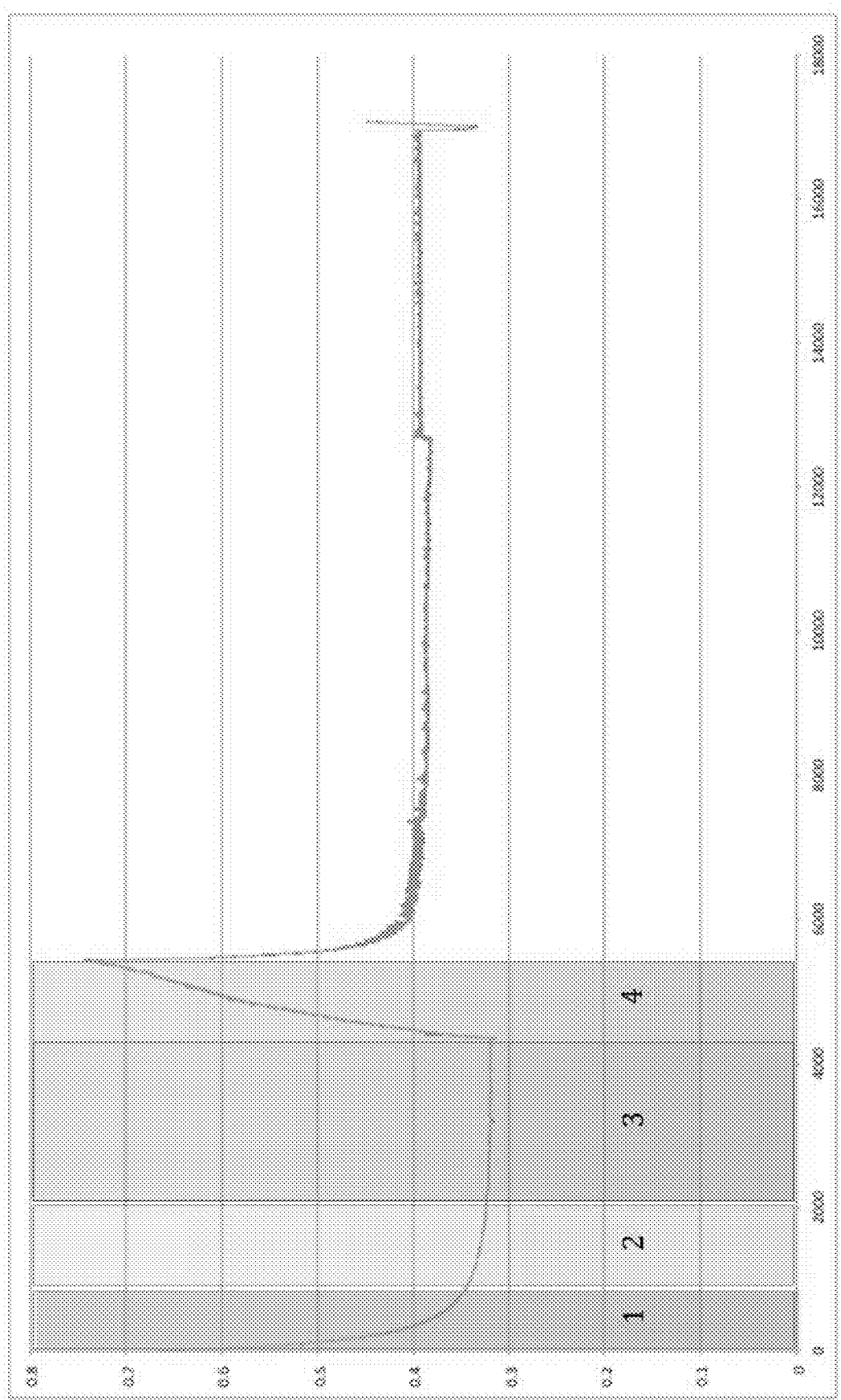
FIG. 5 is a diagram depicting an example set of dynamic correction factors that can be utilized based on the measurement of temperature at a luminary as discussed with regard to FIG. 3.

FIG. 5 is a diagram depicting an example set of dynamic correction factors that can be utilized based on the measurement of temperature at a luminary as discussed with regard to FIG. 3. The plot of FIG. 5 is based on an inverse of the plot of FIG. 4 (i.e., plotted values of FIG. 5 are equal to 1 minus the values of FIG. 4. The example of FIG. 5 indicates four zones associated with a cycle of turning a light source on and then off. A first zone (1) spans about 1.0 s (1000 ms). During the first zone time period, the measured temperature in the light bulb is multiplied by a value having a steep exponential decay from a coefficient of 1.0 towards an asymptote of a bit over 0.3 in the case of this given luminary. In one example, during this time period, the data processor multiplies the measured temperature by a correction factor of:

$$CF=(1-0.68)^t \qquad \text{Eq. 1}$$

where t is a time ranging from 0 to 1 seconds.

A second zone (2) also spans about 1.0 s, from t=1 s to t=2 s. During the second zone time period, the correction factor still has a decay but with a much shallower slope. That slope may be a near linear fit for most practical purposes, although in some embodiments a curve fit is used. In one example, during this time period, the data processor multiples the measured temperature by a correction factor of:

$$CF=-0.03t+0.38 \qquad \text{Eq. 2}$$

where t is a time ranging from 1 to 2 seconds. A third zone (3) ranges from t=2 s until the light source is turned off and represents a steady state time period where the heat level from the power source that is experienced at the temperature sensor does not change. During this time period, the correction factor in the example of FIG. 5 is equal to 0.32. A fourth zone (4) beginning when the light source is turned off around t=4.2 s adjusts the measured temperature based on a diminishing amount of heat being experienced from the light source. The correction factor in this time period, in one example, is modeled as linear, such as:

$$CF=0.75(t-t\text{off})+0.32 \qquad \text{Eq. 3}$$

where $t_{off}$ indicates a time that the light source was turned off. In the example of FIG. 5, the fourth zone correction factor is valid for one second.

In certain examples, the correction factors described in FIG. 5 can further be adjusted based on the power level of the light source. If it is determined that the heat output of the light source at 50% is half that of the light source at 100%, the correction factor can further be adjusted accordingly.

Figure 6:
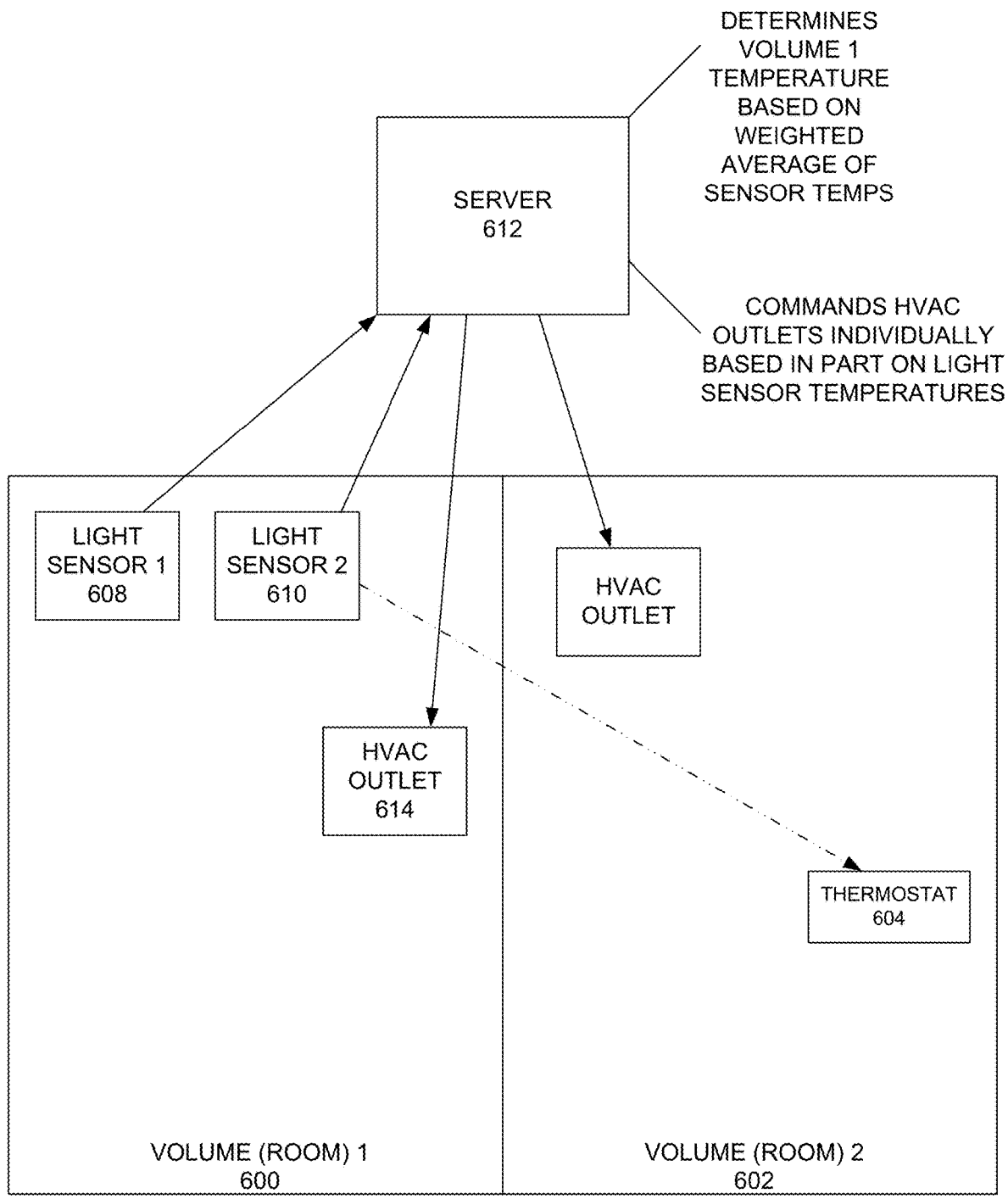
FIG. 6 is a diagram depicting a system for monitoring a temperature in a volume using luminary based sensors.

FIG. 6 is a diagram depicting a system for monitoring a temperature in a volume using luminary based sensors. The system seeks to control the temperature in volume 1600, despite volume 1600 not including any thermostats for measuring the local temperature. The only thermostat 604 is in volume 2602. In some configurations the temperature may vary substantially between volume 1600 and volume 2602, where the HVAC settings in volume 1 are controlled based on thermostat-sensed temperatures measured at 604 in volume 2606. The example of FIG. 6 utilizes additional temperature sensors positioned in, on, or near luminaries positioned near the ceiling of volume 1600, indicated at 608, 610. Those light based sensors 608, 610 measure ambient temperatures that may be influenced by a state of the corresponding or neighboring light sources. Processors at the sensors 608 may adjust the measured temperatures based on correction factors, as described herein, prior to transmitting temperature data to a server 612. In another example, temperature data can be transmitted to the server 612 in raw form with corrections being made at the server. The server 612 determines an estimated temperature of volume 1600, such as based on a weighted average of the corrected sensor temperatures from 608, 610. In some embodiments, additional factors are considered in determining an estimated temperature of volume 1601. Based on the determined estimated temperature, the server 612 commands the thermostat 604 to output warmer or colder air to the volume 1600 specific HVAC outlet 614. It is noted in some examples, that such processing could be performed using a processor of one of the luminaries (i.e., sensor 608 transmits its temperature data to 610; the data processor at 610 combines its temperature data with that from 608 to determine a volume 1600 temperature, and light based sensor 610 transmits commands directly to the thermostat 604 to adjust the output of HVAC outlet 614.

As noted above, a number of additional factors could be considered by a server or light sensor processors in determining estimated ambient temperatures. In one example, correction factors for each of a plurality of light source status zones are bulb type specific. Temperature estimates could further be adjusted based on factors such as whether the associated light bulb is within a lampshade, an open fixture, an enclosed fixture, or a recessed fixture (e.g., a recessed can fixture will typically measure ambient temperatures higher than an open fixture because more heat from the light source will be retained within the fixture). Corrections to measured temperatures could further be based on ambient light detected in a volume being considered. Sunlight into a room can result in it feeling 3-5 degrees warmer than the actual ambient temperature to occupants. Thus, if ambient light is measured to be high, the estimated temperature or the control to the thermostat can be adjusted accordingly. In another example, an online accessible weather report is accessed to determine a sunlight level in a room. Fans running in a volume can also affect temperature measured by a sensor, with adjustments being made based on detection of such a fan's operation (e.g., via a sensed sound level, sensed air movement, or via an indicated control value for the fan).

Figure 7:
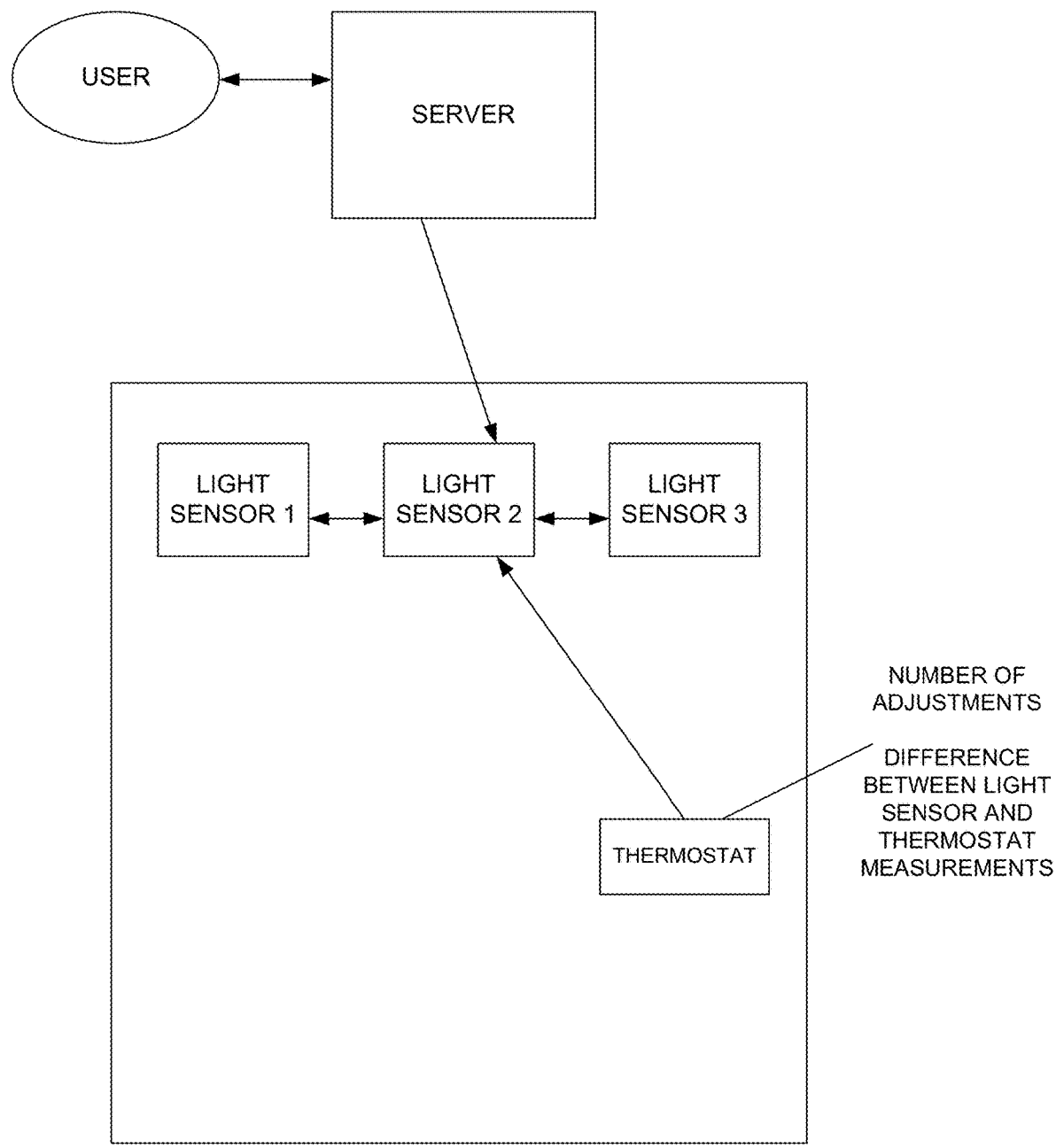
FIG. 7 is a diagram depicting an automated adjustment of correction factors based on user-thermostat adjustment.

FIG. 7 is a diagram depicting an automated adjustment of correction factors based on user-thermostat adjustment. In the example of FIG. 7, a plurality of light-based temperature sensors take temperature sensors of a volume and transmit temperature data to a server. That server adjusts a thermostat for the room, heating or cooling the volume. A server may monitor how often a user adjusts the thermostat manually, overriding the control of the server. If a user consistently turns down the temperature manually, the server can adjust accordingly, realizing that the current server setting for a target estimated temperature to turn on the air conditioning is too high. If the user seldom manually adjusts the thermostat, then the server can continue operating as-is, with the understanding that the current correction factors and algorithms are likely well-calibrated.

Figure 8:
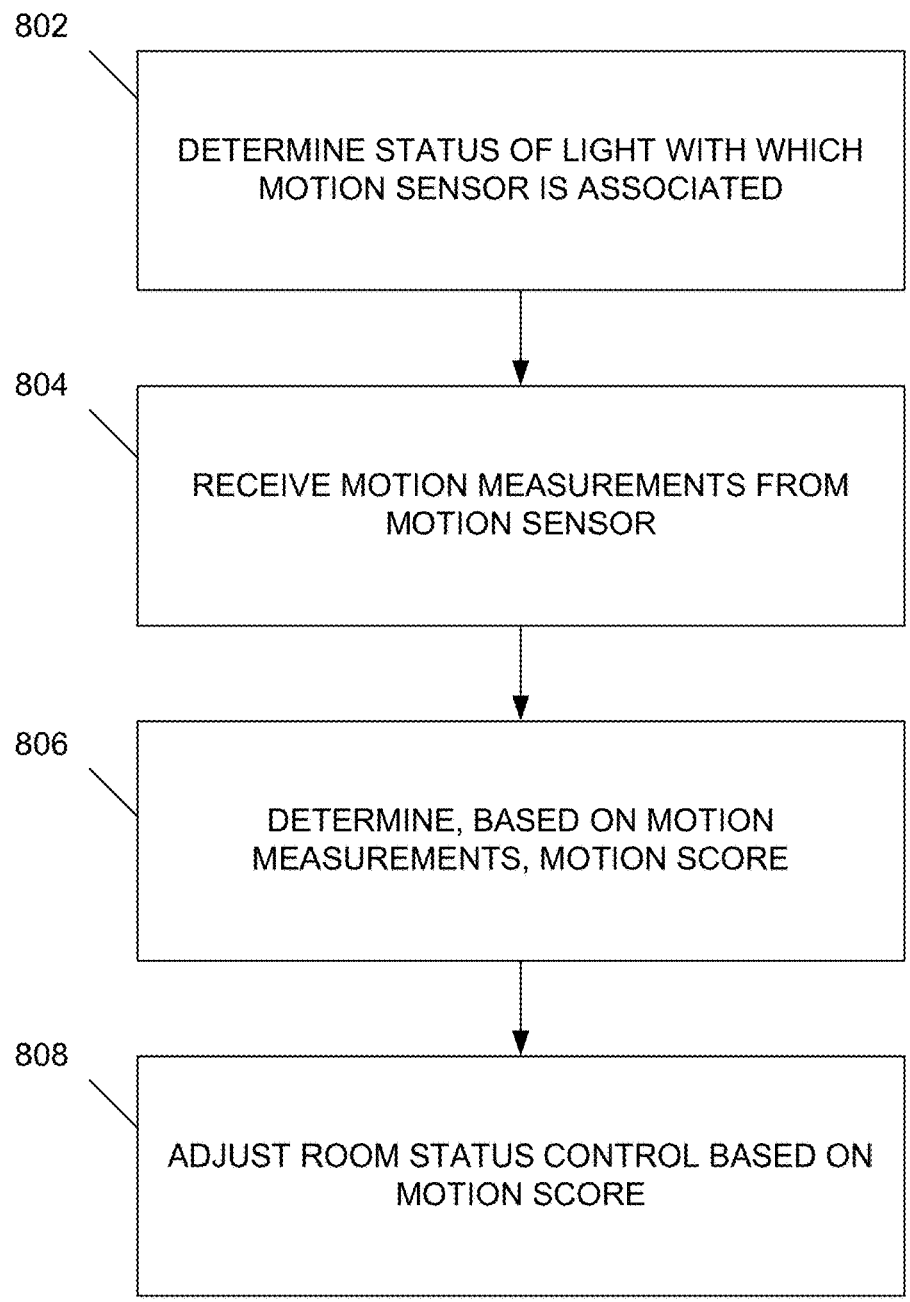
FIG. 8 is a flow diagram depicting a processor-implemented method of determining motion in a volume using a lighting based sensor.

FIG. 8 is a flow diagram depicting a processor-implemented method of determining motion in a volume using a lighting based sensor. At 802, a status of a light with which a motion sensor is associated is determined. Motion measurements received via the motion sensor at 804. At 806, a motion score is determined based on the motion measurements. A room control (e.g., light level, temperature setting) is adjusted based on the motion score, at 808.

Figure 9:
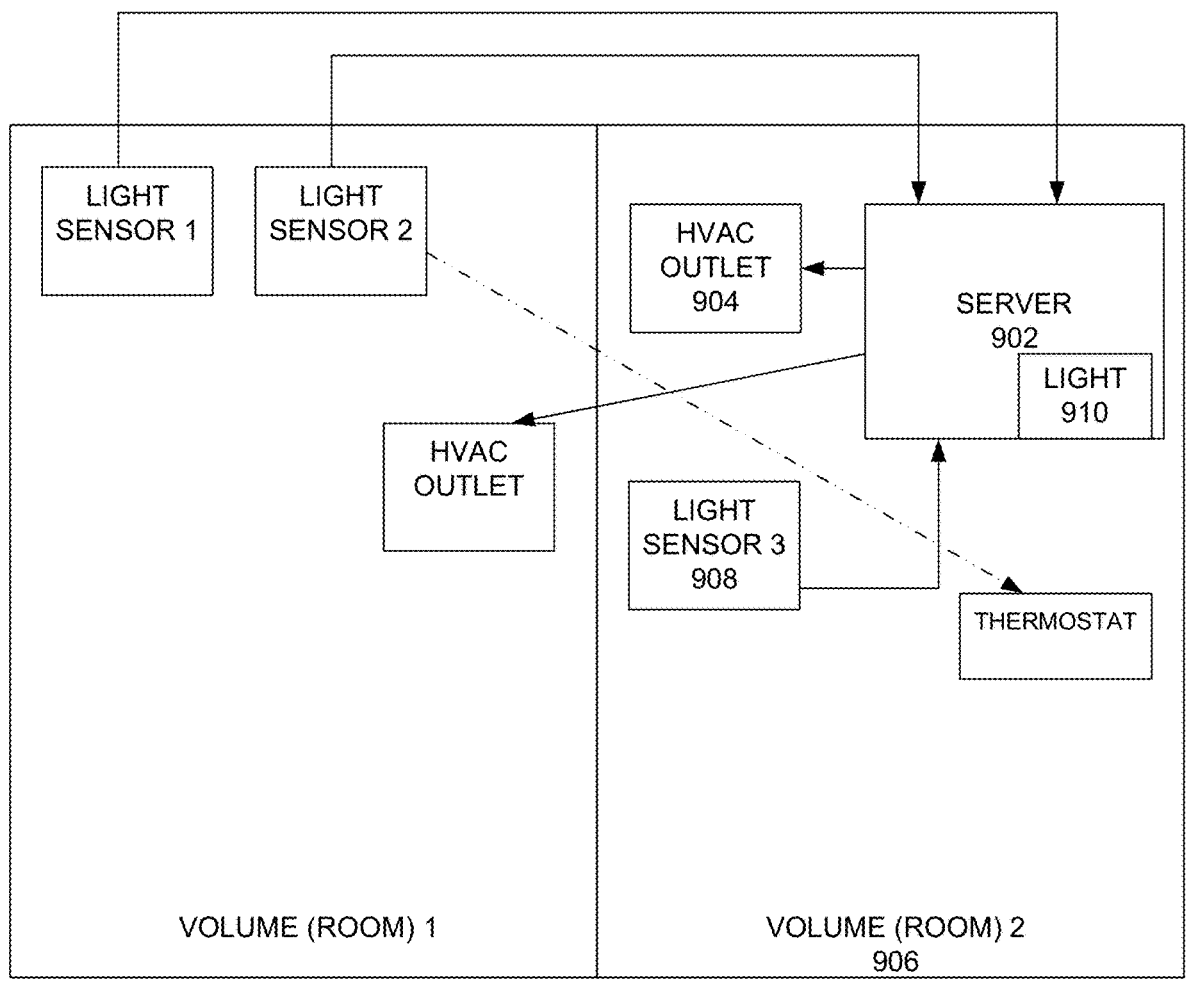
FIG. 9 is a diagram depicting a system where the server resides in one of the volumes and can be a source of sensor data itself.

As described above with reference to FIG. 6, measurements (e.g., temperature measurements) can be taken at light sensors and transmitted to a server to make adjustments (e.g., HVAC adjustments). FIG. 9 is a diagram depicting a system where the server resides in one of the volumes and can be a source of sensor data itself. In the example of FIG. 9, the server 902 is configured to measure ambient temperature data itself and incorporate that server-measured temperature data into its control of the HVAC system 904. In the example of FIG. 9, the server 902 resides in volume 2906 and can, thus, be used as a data point for adjusting the HVAC system 904 in volume 2.

In another example, the server 902 can provide ambient light measurement data to adjust lighting in rooms, such as sensor containing light bulbs. In the example of FIG. 9, the server 902 receives data from light sensor 3908 that resides in volume 2906 and/or light data measured at the server 902 itself. Based on light data received from one or more of the sensors in volume 2906, the server can command light adjustments in that volume. For example, the server 902 can command dimming of light at light sensor 3908 based on ambient light detected or a time of day (e.g., a night light timer setting). In one example, the server 902 itself includes a light 910 that can be adjusted based on ambient light (e.g., ambient light detected at the server 902). In one embodiment, the light 910 includes a relax mode setting when in a night light mode, having a color temperature of 2200 degrees Kelvin. Lighting levels in individual or all volumes (e.g., total desired lighting levels that are met via ambient light measurements and adjustments) can be controlled by a user, such as through communications with the server 902 directly or via an intermediary such as a smart phone application. Temperature levels in individual or all volumes can be similarly controlled by users.

This application uses examples to illustrate the invention. The patentable scope of the invention includes other examples. For example, to enable continued temperature measurement when a light source is off (i.e., typically a light bulb draws no power when off due to an open circuit), a system can be configured to maintain a closed circuit, even when the light source is off, so that temperature sensor operations can still be maintained, despite the light source being off (e.g., at night).

As another example, in a volume having multiple light based temperature sensors, a server or light-based data processors can compare temperature measurements among the sensors in the volume to determine whether any are outliers. Such sensors giving out of family measurements can be voted out or otherwise ignored when controlling the volume environment.

In another example, a distance sensor can be incorporated into a luminary to determine a distance to the floor and an area (e.g., 4-8 feet off the floor) where temperature control is most desirable). Temperature measurements at the luminary can be adjusted based on a distance from the luminary to the floor or region of desired control.

In one example, a number of correction factor profiles for time period zones (e.g., zones (1)-(4) of FIG. 5) could be included in a luminary based memory, each profile being associated with a calibration operation temperature pattern. A calibration operation is performed as described in FIGS. 3 and 4, with the resulting temperature pattern (e.g., as depicted in FIG. 4) being compared to the baseline patterns stored in the memory. Correction factors associated with a closest matching baseline pattern could then be selected.

As another example, in addition to providing light-based sensing of ambient light and temperature, lights can be configured to detect motion, where environment characteristics can be adjusted based on that detected motion. For example, lights can be turned on or have their levels changed when motion, or a particular type of motion, is detected in a room. Temperature settings can similarly be changed.

Figure 10:
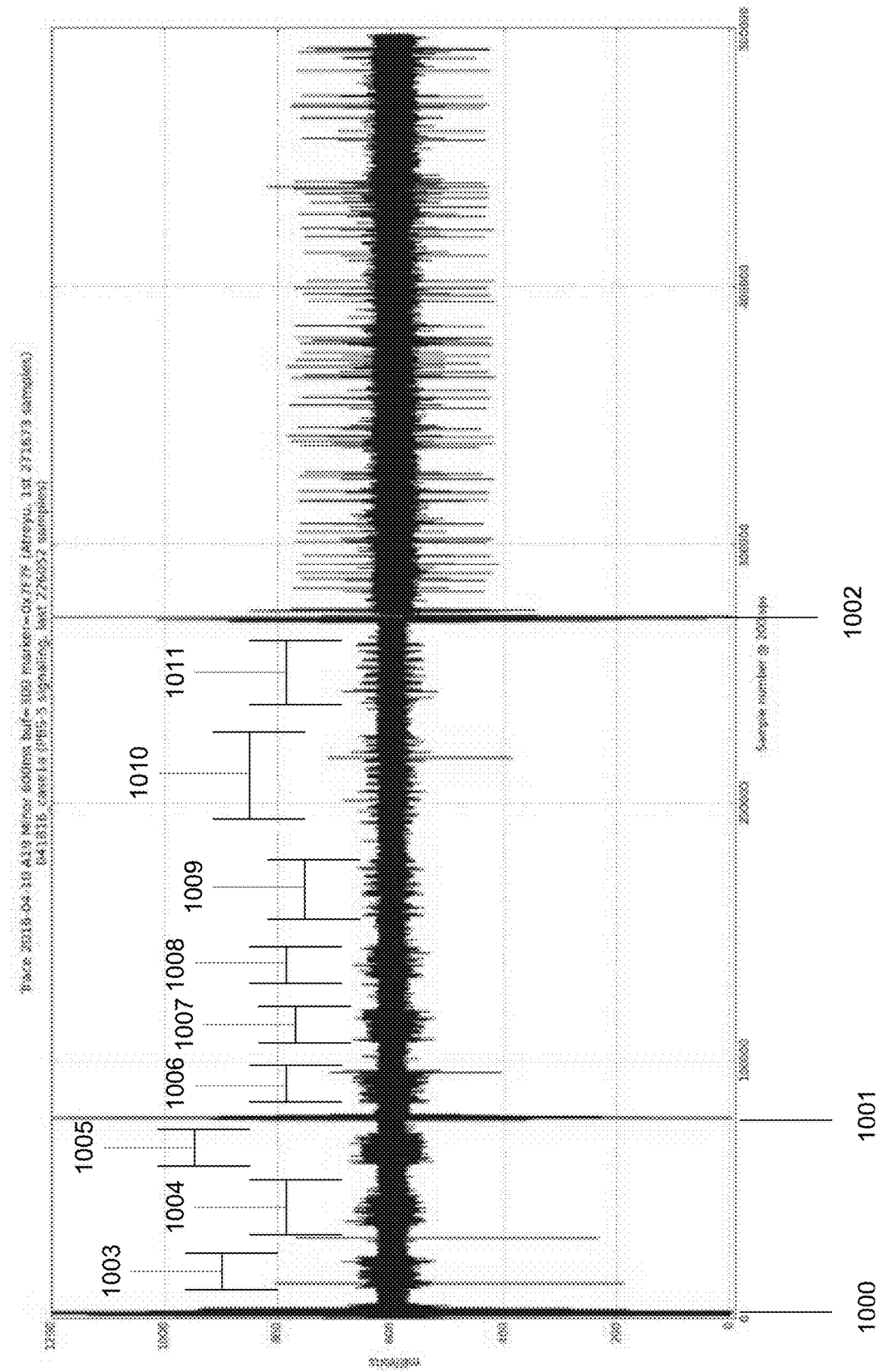
FIG. 10 is a diagram depicting test spliced motion signal measurements from a light taken by two different signal sources (e.g., Atreyu and PBS-5).

Using distributed (e.g., light bulb-based) sensors, motion can be detected using a variety of methods as further described herein. Such discrimination may be dependent upon how clean the electrical environment is surrounding the sensors. For example, noise may impact distinguishing motion (e.g., major motion, minor motion) from quiescence. FIG. 10 is a diagram depicting test spliced motion signal measurements from a light taken by two different signal sources (e.g., Atreyu and PBS-5). The Atreyu signal occurs between sample 0 and 271,673 and the PBS-5 signal begins after sample 271,673 for the remaining samples illustrated in FIG. 10. Three instances of major motion occurred in this test spliced motion signal as illustrated by instance 1000, 1001, and 1002. One example of minor motion can result from consistent movement each having approximately one minute durations. This example minor motion is reflected in the test spliced motion signal falling within the ranges depicted as 1003, 1004, 1005, 1006, 1007, and 1008 of FIG. 10. Another example type of minor motion can include alternately moving for a short time duration (e.g., 5 seconds) followed by no motion (e.g., holding still) for another time duration (e.g., 10 seconds). This alternating motion example is reflected in the test spliced motion signal falling within the ranges depicted as 1009, 1010, and 1011. As illustrated in FIG. 10, the PBS-5 signal has a quiescent signal greater in general amplitude than the sections of the Atreyu signal. This accentuates the challenge of identifying minor motion in the Atreyu signal portion while not generating false alarms in the PBS-5 signal portion.

Figure 11:
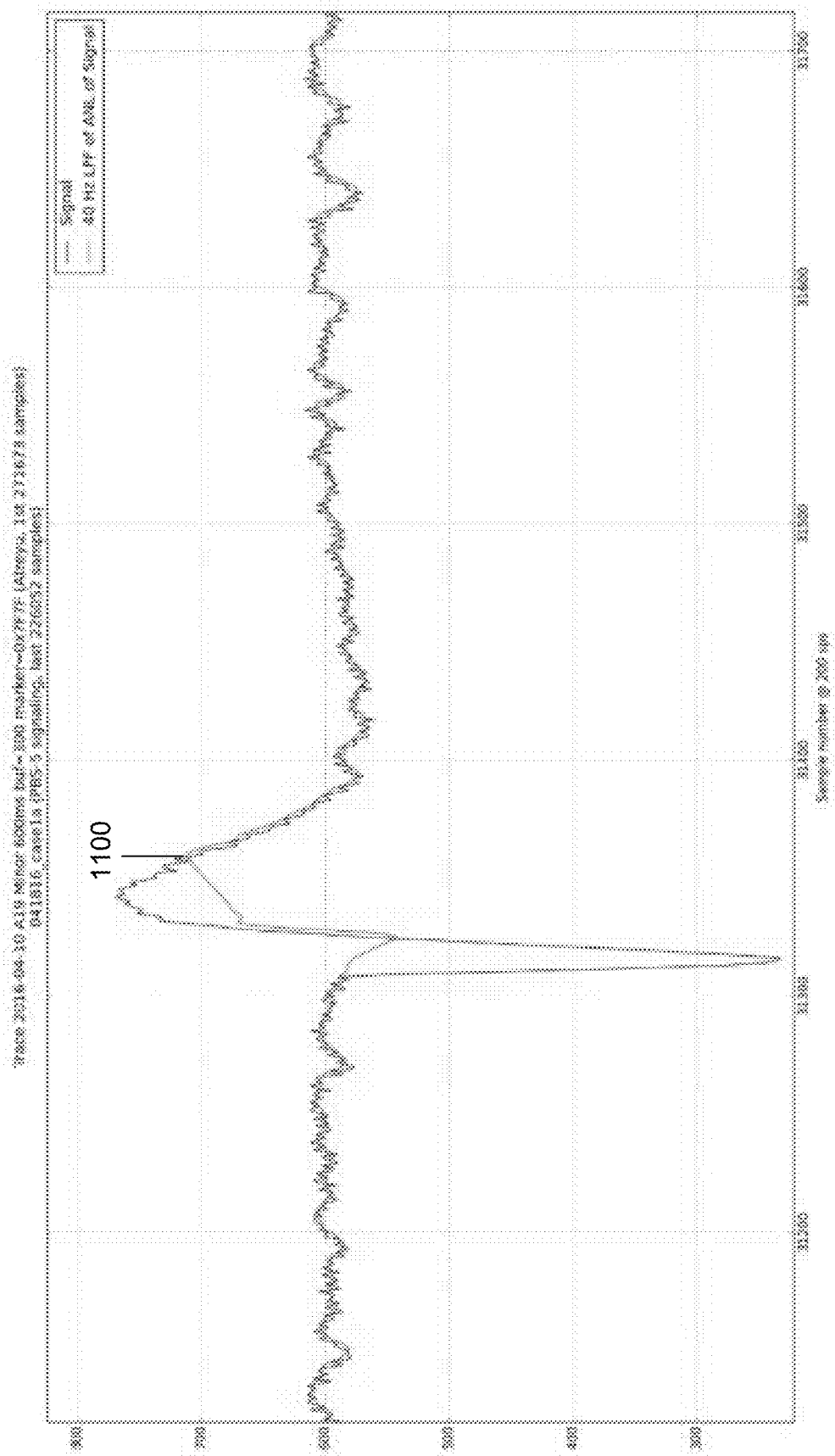
FIG. 11 is a diagram depicting a zoomed in portion of the test spliced motion signal of FIG. 10.

FIG. 11 is a diagram depicting a zoomed in portion of the test spliced motion signal of FIG. 10. A 60 Hz hum is illustrated in FIG. 11 along with the system response to a spike caused by motion detection. The 60 Hz hum can be largely eliminated by a low-pass filter (LPF), and the spike can be cut off by adaptive noise limiting (ANL) resulting in the 40 Hz LPF of ANL signal is also illustrated in FIG. 11. However, a residual part of the spike response (e.g., 1100) can cause problems for amplitude-based algorithms.

Figure 12:
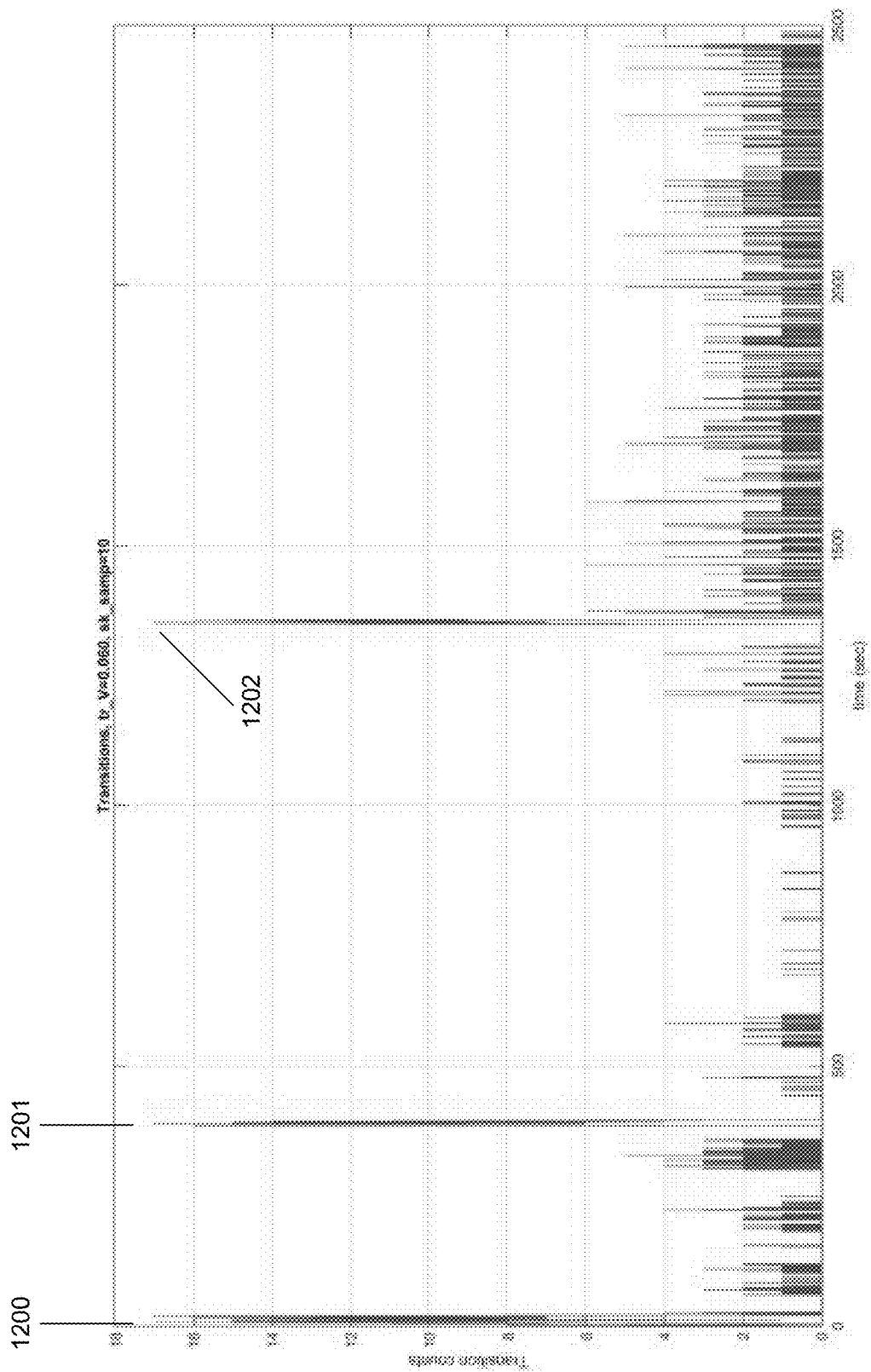
FIG. 12 is a diagram depicting the application of the transition counting algorithm.

One example motion detecting algorithm is a transition counting algorithm. Using a transition counting algorithm, motion is detected based on detecting a rise in a signal frequency. This transition counting algorithm is based on the Doppler frequency being proportional to velocity. The frequency is gauged by the rate of reversals in the direction of the signal. Motion for a given point is calculated using data from a point to the right of the given point such that the actual response lags the resulting algorithm plot. The transition counting algorithm evaluates the strength of motion at any given time by constructing a picket fence of samples (e.g., 20 samples) selected at constant intervals (e.g., 10 sample intervals) from a reference time. The delta-voltage from one picket to the next is evaluated. The delta-voltage is compares to a threshold voltage in order to determine if there has been a significant movement detected. For example, if the delta-voltage exceeds the threshold voltage, then a significant movement is detected. A motion score can be determined based on the number of direction reversals among the significant movements counted. In one example, FIG. 12 is a diagram depicting the application of the transition counting algorithm. Use of the algorithm detects peaks in transition counts 1200, 1201, and 1202 which correlate to the major motion instances 1000, 1001, and 1002, respectively. Application of the LPF with ANL is also illustrated in FIG. 12. In some embodiments, use of the transition algorithm can be applied to motion signal representations generated by algorithms described herein so as to determine a motion score.

Figure 13:
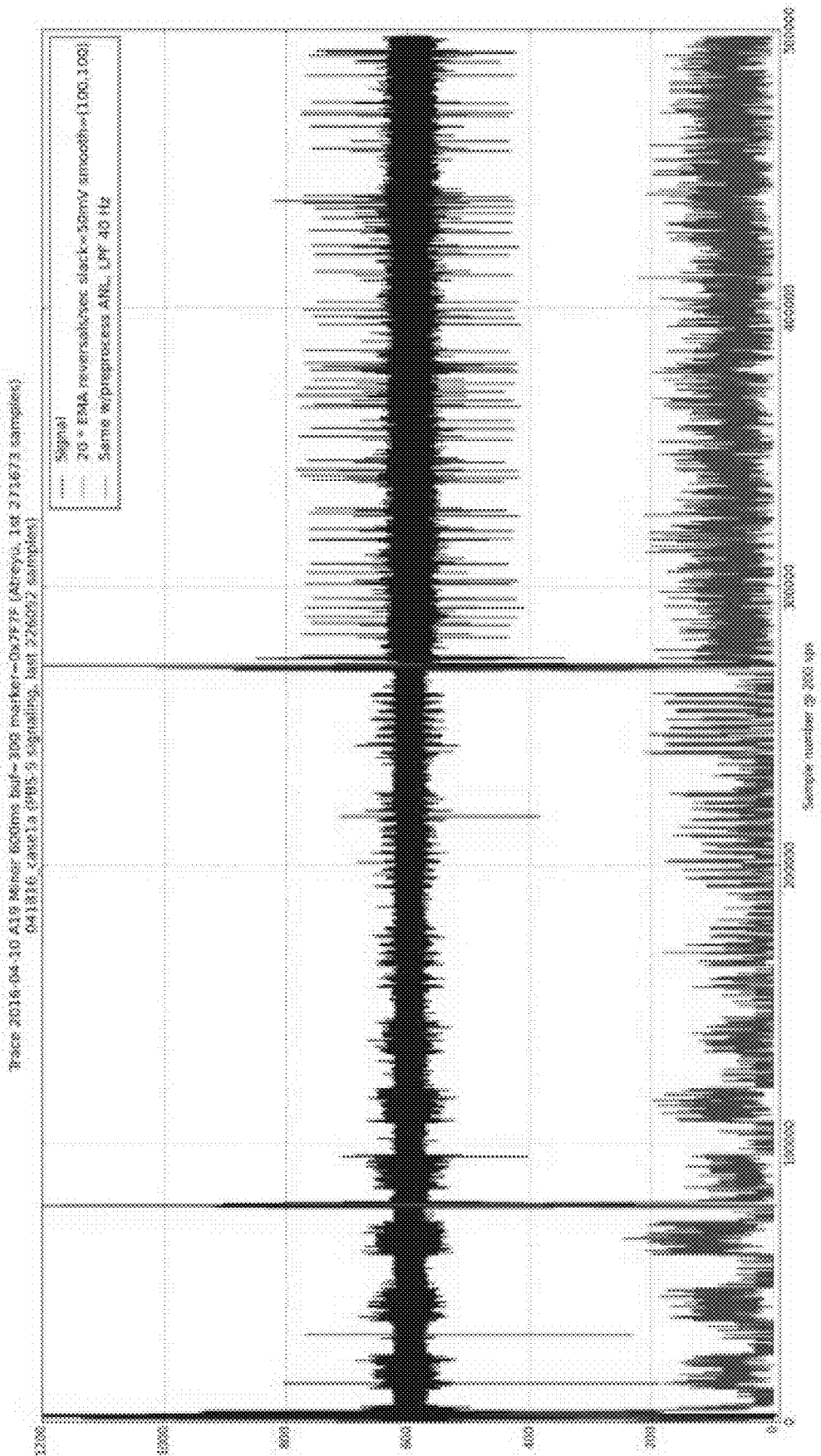
FIG. 13 is a diagram depicting the application of the smoothed reversal counts algorithm.

Smoothed reversal counts is an example motion detecting algorithm used to generate a motion signal representation. Using a smoothed reversal counts algorithm, the signal is evaluated for up and down indications and a most-extreme value. If the signal data point exceeds a most-extreme value, that data point value updates the most-extreme value variable. The next data point value that is below this new most-extreme value (e.g., slack) reverses the direction indicator and updates the variable. A motion score is determined based on the count of recent reversals. In one example, the motion score can be determined by adding or averaging the recent per-sample values (e.g., reversal=0, non-reversal=1). Such an average, in one example, is a weighted moving average (EMA). The weighted moving average can be applied more than once (e.g., twice) so as to provide for extra smoothness in the output signal. Using a slack threshold allows for tuning ability and avoids responding to noise, along with adjusting the sensitivity. FIG. 13 is a diagram depicting the smoothed reversal counts algorithm illustrating the original signal, a smoothed signal using EMA for smoothing, and a further processed signal after being passed through a LPF with ANL. Using the smoothed reversal counts algorithm, the major motion instances 1000, 1001, and 1003 are detected. The LPF and ANL processing help distinguish minor motion from quiescence. In the absence of impulsive noise, use of the smoothed reversal counts algorithm detects minor and/or distant motion.

Figure 14:
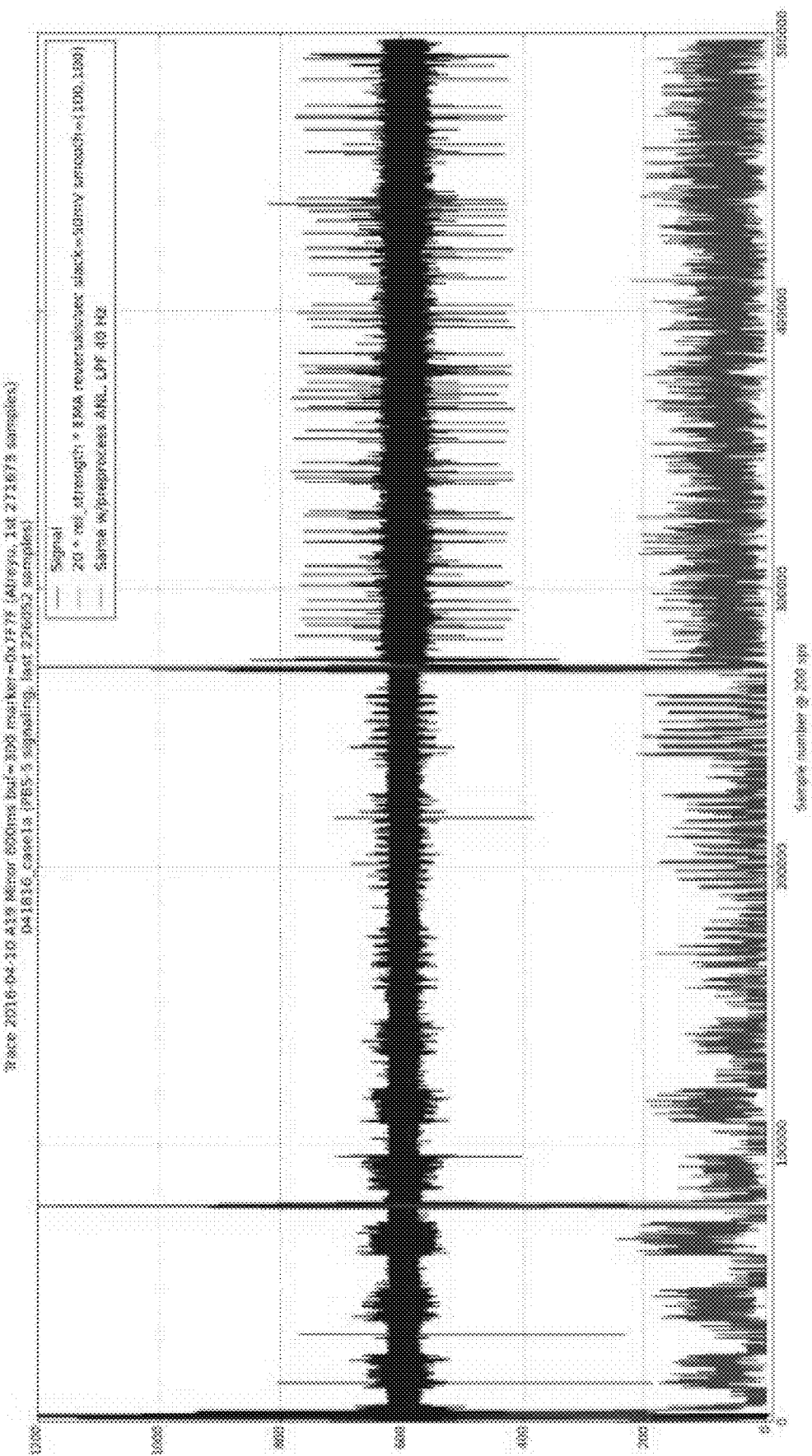
FIG. 14 is a diagram depicting the application of the smoothed reversal count algorithm adjusted for relative signal strength.

Another example algorithm for motion detection includes a smooth reversal count that is adjusted for relative signal strength. In some instances, the frequency of test spliced motion signal drops as a result of a subject walking past the motion sensor relative to what it is in approach or departure, despite the signal strength being higher. A reversal count of the signal can be multiplied by a variable that divided signal strength to the smoothed prior signal strength. FIG. 14 is a diagram depicting the output of the smoothed reversal count algorithm discussed herein, adjusted for relative signal strength.

Figure 15:
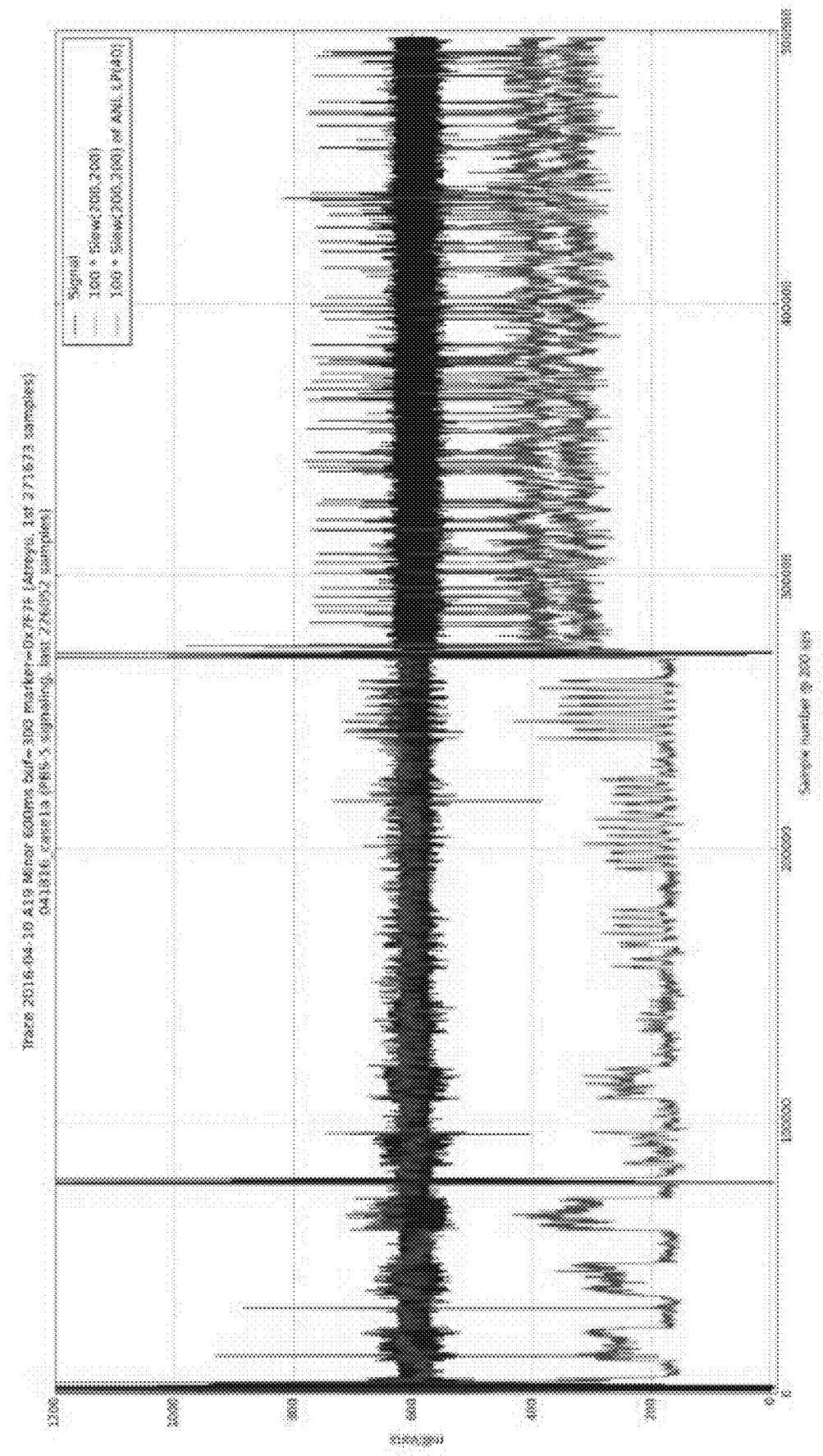
FIG. 15 is a diagram depicting the application of the slew rate algorithm.

A slew rate algorithm is yet another example motion detecting algorithm that can generate a motion signal representation. Similar to the smooth reversal count algorithm, the signal is multiplied by a frequency proxy based on relative amplitude. The derivative of the signal rises with both amplitude and frequency. Using a moving average of absolute differences from one sample to the next provides for multiplying the amplitude by the frequency. FIG. 15 is a diagram depicting the output signal resulting from the slew rate algorithm. As illustrated in FIG. 15, the major motion instances are identified using the slew rate algorithm. The output of the slew rate algorithm can also be passed through a LPF with ANL to generate an output as illustrated in FIG. 15.

Figure 16:
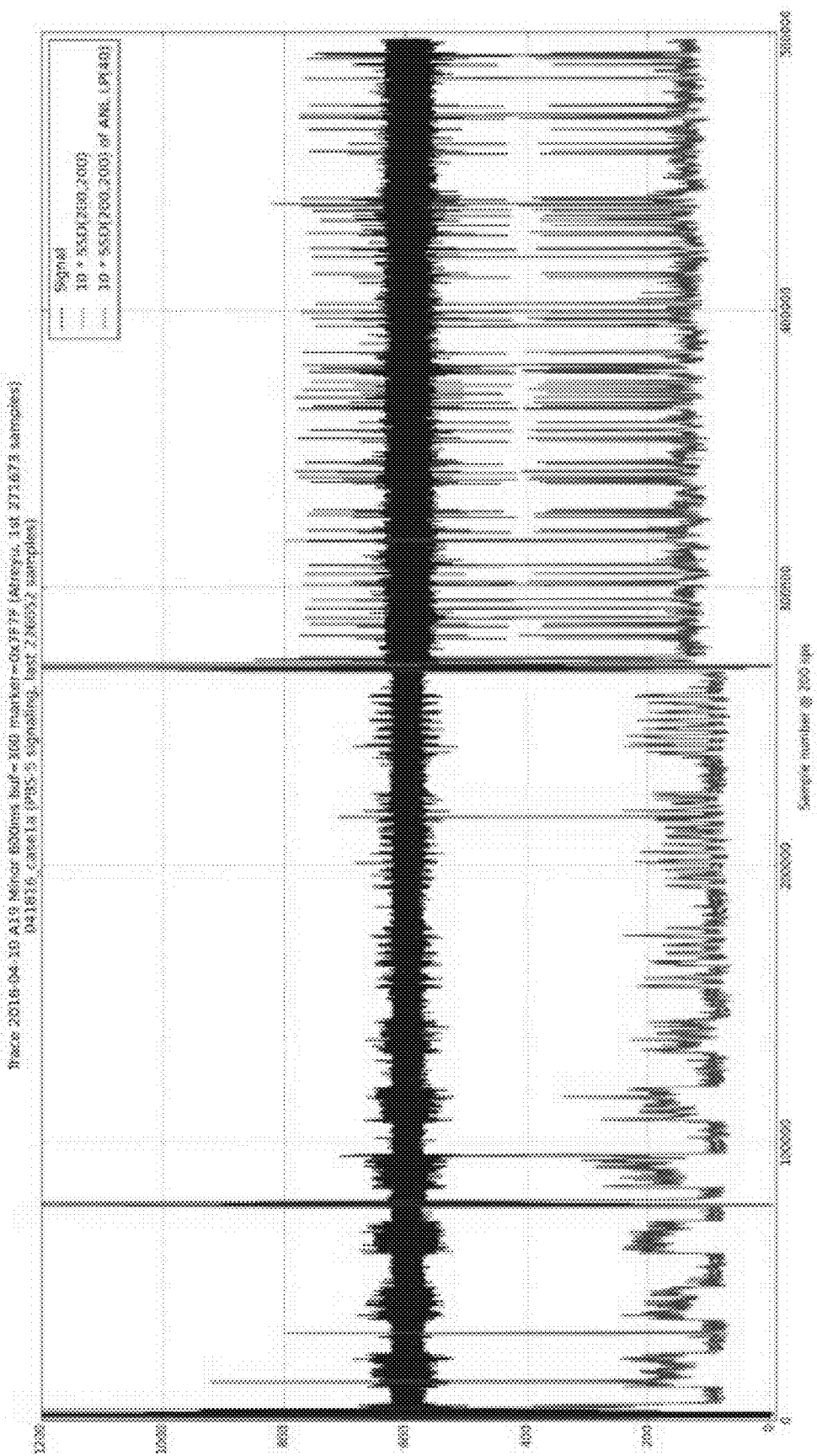
FIG. 16 is a diagram depicting the application of the smoothed standard deviation algorithm.

Another example motion detection algorithm is the smoothed standard deviation algorithm that can generate a motion signal representation. Using this algorithm, a time-smoothed variance of the signal is measured. FIG. 16 is a diagram depicting the output of the smoothed standard deviation algorithm along with the output signal passed through a LPF with ANL.

Figure 17:
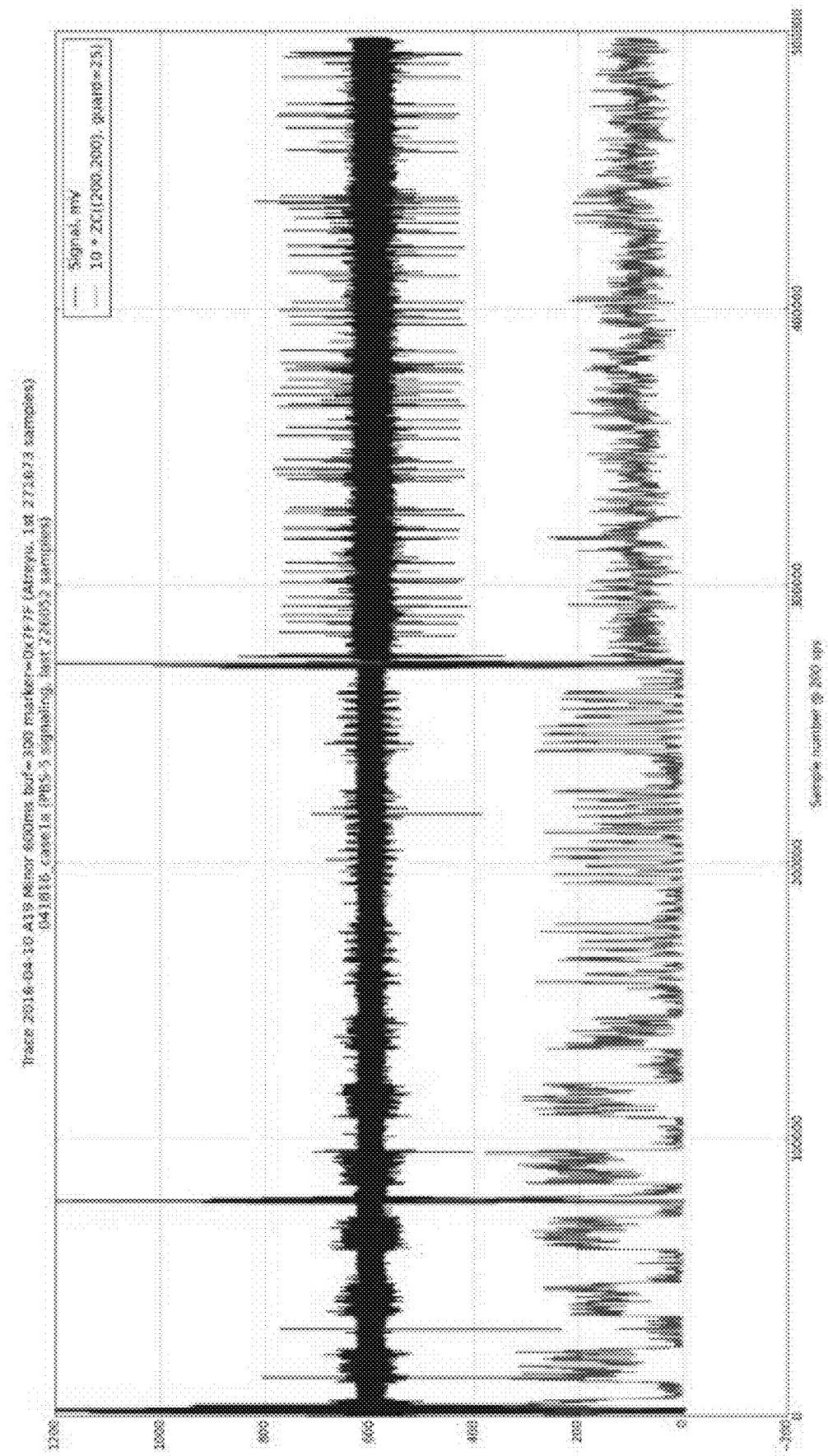
FIG. 17 is a diagram depicting the application of the smoothed zero crossing algorithm.
Figure 18:
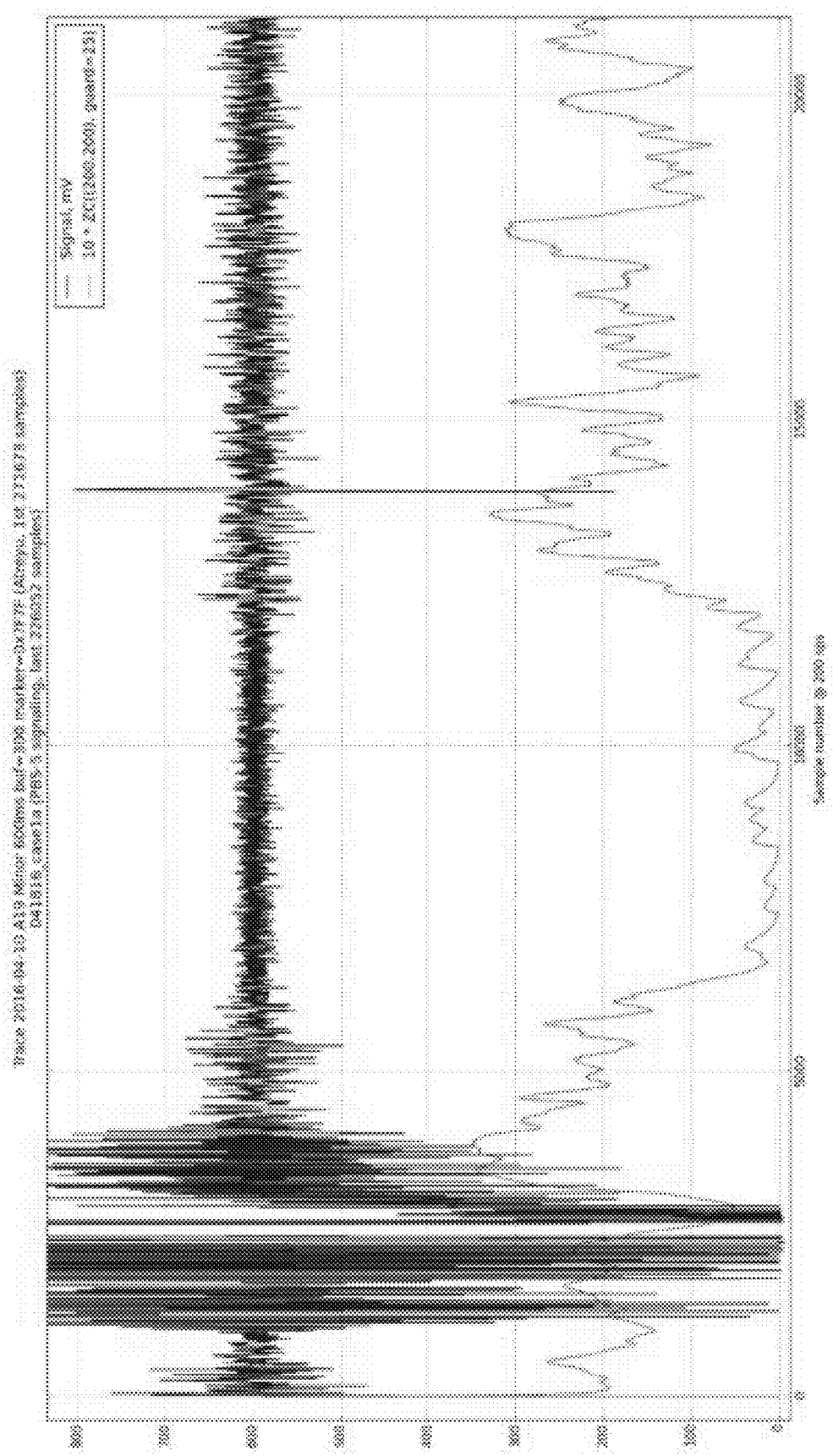
FIG. 18 is a diagram depicting a zoomed in section of FIG. 17.
Figure 19:
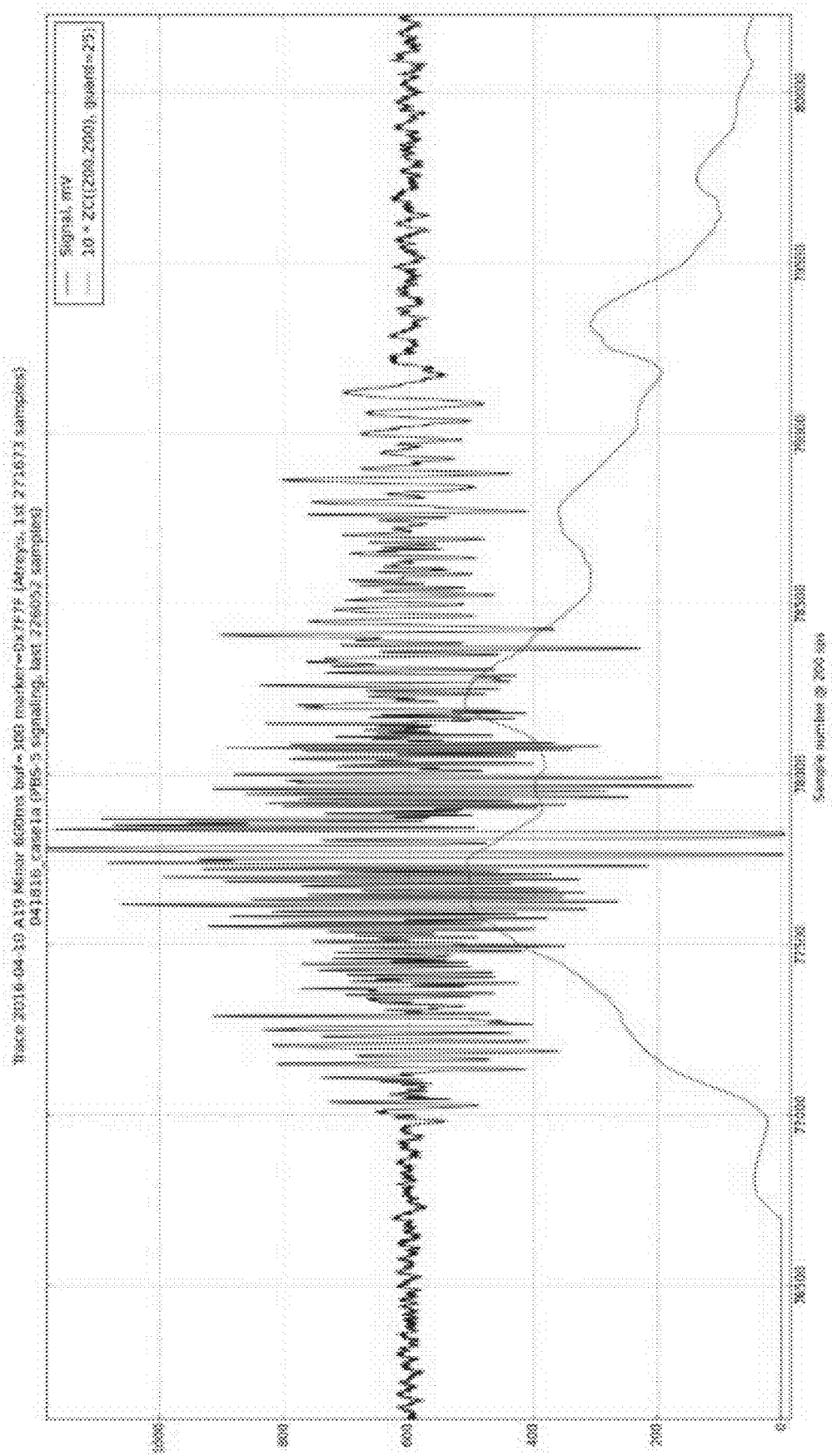
FIG. 19 is a diagram depicting a zoomed in section of FIG. 18.
Figure 20:
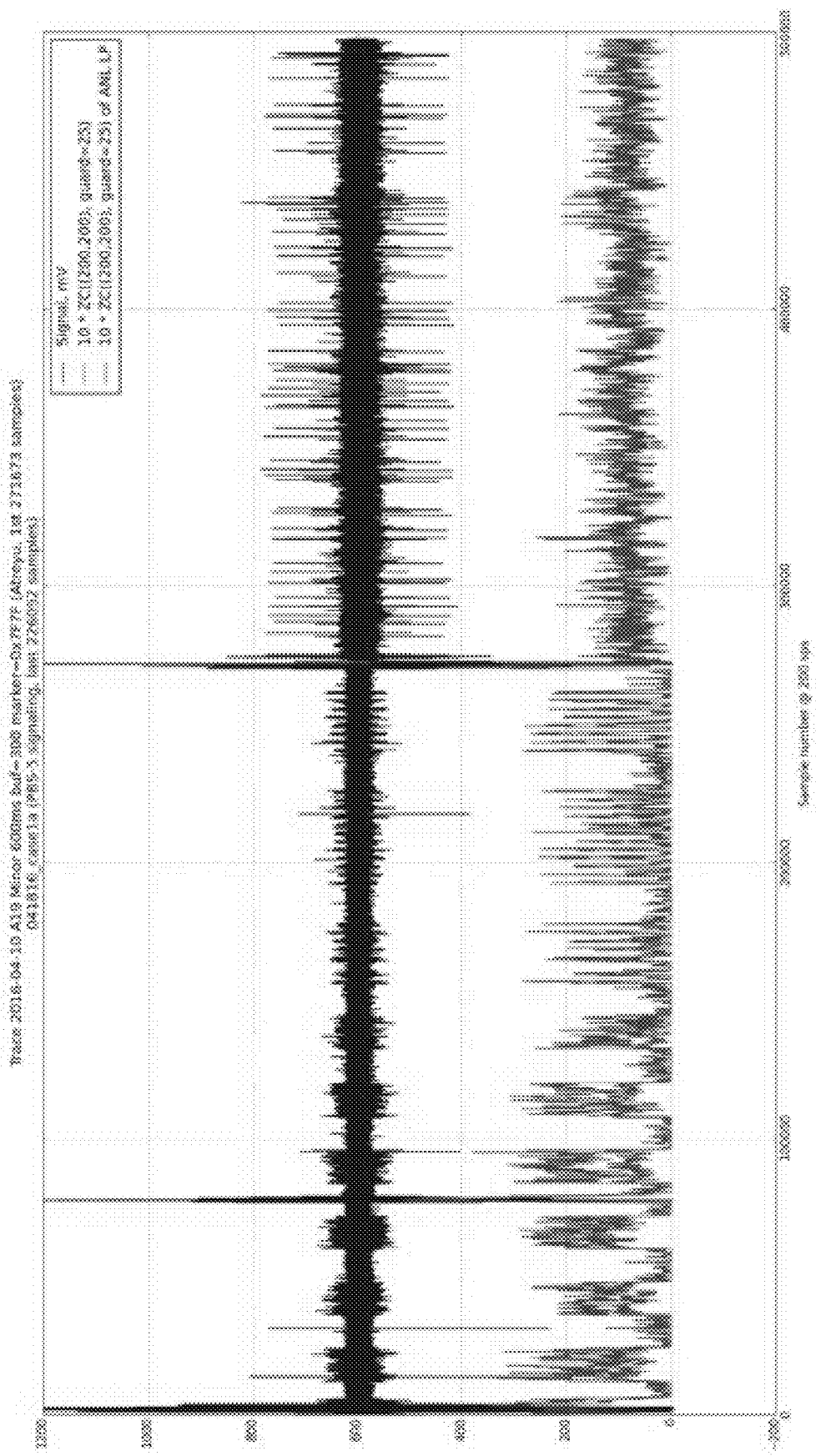
FIG. 20 is a diagram depicting the application of a LPF with ANL to FIG. 17.

A smoothed zero crossing algorithm is another example algorithm that can generate a motion signal representation. Using the smoothed zero crossing algorithm, the frequency of the signal is determined. A DC bias is subtracted out from the signal. A count of the times the signal crosses zero within a time period is used to measure an overall frequency. In the absence of motion, the noise-only signal crosses zero frequently. Such frequency crossings can cause false elevated readings. A guard band is created around the midline of the signal so that a zero crossing is counted only when the swing exceeds a nominal noise level. FIG. 17 is a diagram depicting an output of the smoothed zero crossing algorithm. FIG. 18 is a diagram depicting a zoomed in section of FIG. 17. FIG. 19 is a diagram depicting a zoomed in section of FIG. 18. Both major and minor motion is detected using the smoothed zero crossing algorithm. FIG. 20 is a diagram depicting the output signal of FIG. 17 passed through a LPF and with ANL.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of determining motion in a volume using a lighting based sensor implemented by one or more data processors forming one or more computing devices, the method comprising:

determining, by at least one data processor, a status of a light with which a motion sensor is associated;
receiving, by at least one data processor, motion measurements from the motion sensor; determining, by at least one data processor, based on the motion measurements, a motion score, wherein determining the motion score further comprises:
determining a motion signal representation of the motion measurements;
calculating the motion score based on at least one of a number of transitions in the motion signal representation and a number of smoothed reversals in the motion signal representation, wherein calculating the motion score comprises:
comparing a data point of the motion signal representation to a most-extreme value variable;
replacing the most-extreme valuable variable with the data point if the data point exceeds the most-extreme value variable;
identifying a next data point below the most-extreme value variable as one of the smoothed reversals in the motion signal representation; and
averaging corresponding voltages of recent smoothed reversals to determine the motion score;
adjusting, by at least one data processor, a room status control based on the motion score; and
adjusting, by at least one data processor, a room light level or a room temperature based on the room status control.

2. The method of claim 1, wherein averaging comprises an exponentially weighted moving average.

3. The method of claim 2, wherein determining the motion score further comprises generating a smoothed motion signal representation, by multiplying the motion signal representation by a smoothing factor.

4. The method of claim 3, wherein determining the motion score further comprises averaging absolute differences between each sample.

5. The method of claim 1, wherein determining the motion signal representation comprises a time-smoother variance of the motion measurements.

6. The method of claim 1, wherein the motion type comprises a major motion, a minor motion, or no motion.

7. The method of claim 1, further comprising transmitting the motion score from the light to a remote location.

8. The method of claim 7, wherein the remote location comprises an HVAC system.

9. The method of claim 1, wherein the room status control comprises a light level or temperature setting.

10. The method of claim 1, wherein calculating the motion score based on a number of transitions in the motion signal representation comprises:
picketing a subset of samples of the motion signal representation over a constant interval;
determining a delta-voltage between each sample of the subset of samples; and
comparing the delta-voltage to a predetermined threshold, wherein the motion score is based on a number of delta-voltages exceeding the predetermined threshold.

11. The method of claim 1, wherein the smoothed reversals are weighted based on a signal strength of the motion signal representation.

12. The method of claim 1, wherein calculating the motion score is further based on at least one of a slew rate of the motion signal representation.

13. A method of determining motion in a volume using a lighting based sensor implemented by one or more data processors forming one or more computing devices, the method comprising:
determining, by at least one data processor, a status of a light with which a motion sensor is associated;
receiving, by at least one data processor, motion measurements from the motion sensor;
determining, by at least one data processor, based on the motion measurements, a motion score, wherein determining the motion score further comprises:
determining a motion signal representation comprising a plurality of frequencies;
removing a bias from the motion signal representation;
generating a guard band around a midline of the motion signal representation; and
determining a number of zero crossings from the motion signal representation, wherein a zero crossing occurs when the signal exceeds the guard band and the motion score comprises the number of zero crossings;
adjusting, by at least one data processor, a room status control based on the motion score; and
adjusting, by at least one data processor, a room light level or a room temperature based on the room status control.

14. A system determining motion in a volume using a lighting based sensor, the system comprising:
at least one data processor;
memory storing instructions, which when executed by at least one data processor, result in operations comprising:
determining, a status of a light with which a motion sensor is associated;
receiving motion measurements from the motion sensor;
determining, based on the motion measurements, a motion score, wherein determining the motion score further comprises:
determining a motion signal representation of the motion measurements; and
calculating the motion score based on at least one of a number of transitions in the motion signal representation, a number of smoothed reversals in the motion signal representation, and a slew rate of the motion signal representation, wherein calculating the motion score comprises:
comparing a data point of the motion signal representation to a most-extreme value variable;
replacing the most-extreme valuable variable with the data point if the data point exceeds the most-extreme value variable;
identifying a next data point below the most-extreme value variable as one of the smoothed reversals in the motion signal representation; and
averaging corresponding voltages of recent smoothed reversals to determine the motion score;
adjusting a room status control based on the motion score; and
adjusting a room light level or a room temperature based on the room status control.

15. The system of claim 14, wherein averaging comprises an exponentially weighted moving average.

16. The system of claim 15, wherein determining the motion score further comprises generating a smoothed motion signal representation by multiplying the motion signal representation by a smoothing factor.

17. The system of claim 16, wherein determining the motion score further comprises averaging absolute differences between each sample.

18. The system of claim 14, wherein determining the motion signal representation comprises a time-smoother variance of the motion measurements.

19. The system of claim 14, wherein the motion type comprises a major motion, a minor motion, or no motion.

20. The system of claim 14, wherein the operations further comprise transmitting the motion score from the light to a remote location.

21. The system of claim 20, wherein the remote location comprises an HVAC system.

22. The system of claim 14, wherein the room status control comprises a light level or a temperature setting.

23. The system of claim 14, wherein calculating the motion score based on a number of transitions in the motion signal representation comprises:
   picketing a subset of samples of the motion signal representation over a constant interval;
   determining a delta-voltage between each sample of the subset of samples; and
   comparing the delta-voltage to a predetermined threshold, wherein the motion score is based on a number of delta-voltages exceeding the predetermined threshold.

24. A system determining motion in a volume using a lighting based sensor, the system comprising:
   at least one data processor;
   memory storing instructions, which when executed by at least one data processor, result in operations comprising:
      determining a status of a light with which a motion sensor is associated;
      receiving motion measurements from the motion sensor;
      determining, based on the motion measurements, a motion score, wherein determining the motion score further comprises:
         determining a motion signal representation comprising a plurality of frequencies;
         removing a bias from the motion signal representation;
         generating a guard band around a midline of the motion signal representation; and
         determining a number of zero crossings from the motion signal representation, wherein a zero crossing occurs when the signal exceeds the guard band and the motion score comprises the number of zero crossings;
      adjusting a room status control based on the motion score; and
      adjusting a room light level or a room temperature based on the room status control.

* * * * *